US007009881B2

(12) United States Patent
Noguchi

(10) Patent No.: US 7,009,881 B2
(45) Date of Patent: Mar. 7, 2006

(54) SEMICONDUCTOR MEMORY DEVICE

(75) Inventor: Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 10/887,924

(22) Filed: Jul. 12, 2004

(65) Prior Publication Data

US 2005/0254302 A1    Nov. 17, 2005

(30) Foreign Application Priority Data

May 17, 2004    (JP)    ............................. 2004-146112

(51) Int. Cl.
 *G11C 16/00* (2006.01)
(52) U.S. Cl. .......................... 365/185.17; 365/185.03; 365/185.18; 365/185.23
(58) Field of Classification Search ..................... None
 See application file for complete search history.

(56) References Cited

U.S. PATENT DOCUMENTS

| 5,621,684 | A | * | 4/1997 | Jung | ..................... | 365/185.17 |
| 5,673,223 | A | | 9/1997 | Park | ..................... | 365/185.17 |
| 5,808,938 | A | | 9/1998 | Tran et al. | ............... | 365/185.2 |
| 6,044,017 | A | * | 3/2000 | Lee et al. | ............... | 365/185.18 |
| 6,175,522 | B1 | * | 1/2001 | Fang | ..................... | 365/185.18 |
| 6,411,548 | B1 | | 6/2002 | Sakui et al. | ........... | 365/185.17 |

FOREIGN PATENT DOCUMENTS

| JP | 7-111095 | 4/1995 |
| JP | 11-260076 | 9/1999 |
| JP | 2000-76882 | 3/2000 |
| JP | 2000-105998 | 4/2000 |
| JP | 2002-133885 | 5/2002 |
| JP | 2002-358792 | 12/2002 |

OTHER PUBLICATIONS

U.S. Appl. No. 1/106.358, filed Mar. 27, 2002, Goda et al.
U.S. Appl. No. 10/108,574, filed Mar. 29, 2002, Noguachi et al.
U.S. Appl. No. 10/887,924, filed Jul. 12, 2004, Noguchi.

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A semiconductor memory device includes a memory cell unit with a plurality of electrically rewritable memory cells connected in series, two ends thereof being coupled to a data transfer line and a reference potential line via select transistors, respectively, wherein the device has a data read mode defined as to detect a read current flowing between the data transfer line and the reference potential line, and judge data of a selected memory cell in the memory cell unit under the condition of: applying a read voltage to the selected memory cell, the read voltage being set to turn on or off the selected memory cell in accordance with data thereof; applying a pass voltage to remaining unselected memory cells, the pass voltage being set to turn on the remaining unselected memory cells without regard to data thereof; and making the select transistors on, and wherein in the data read mode, the more unselected memory cell or cells located on the source side of the selected memory cell, the higher the pass voltage applied to the unselected memory cell or cells located on the source side of the selected memory cell.

18 Claims, 29 Drawing Sheets

FIG. 19A
FIG. 19B
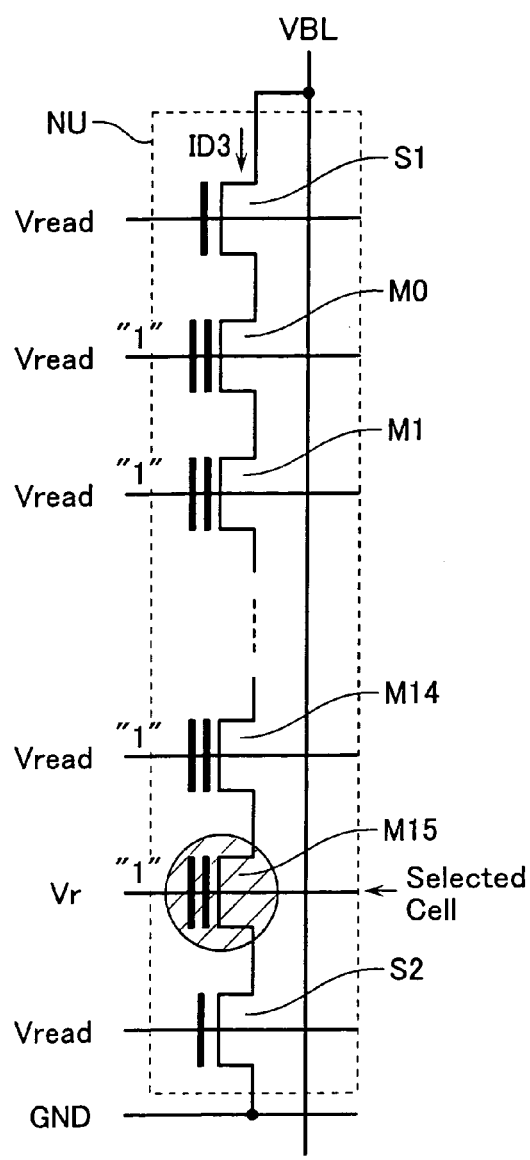
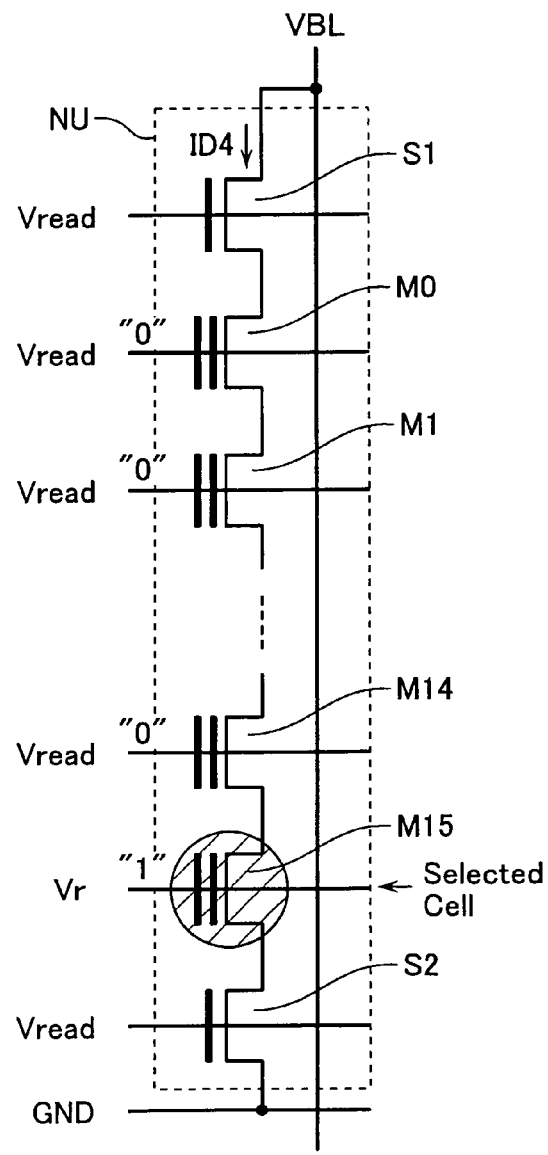

SEMICONDUCTOR MEMORY DEVICE

CROSS-REFERENCE TO RELATED APPLICATION

This application is based on and claims the benefit of priority from the prior Japanese Patent Application No. 2004-146112, filed on May 17, 2004, the entire contents of which are incorporated herein by reference.

BACKGROUND OF THE INVENTION

1. Field of the Invention

This invention relates to a semiconductor memory device in which a plurality of memory cells are connected in series to constitute a memory cell unit.

2. Description of Related Art

A memory cell in an EEPROM has usually a MISFET structure which is formed of a semiconductor substrate with a charge storing layer and a control gate stacked thereabove. This memory cell stores data in a non-volatile manner, as defined by a threshold state in which charges are injected into the charge storing layer and another threshold state in which the charges have been released. The charge injecting/releasing is done by a tunneling current trough a tunnel insulating film between the substrate channel and the charge-storing layer. In various EEPROMs, a so-called NAND-type EEPROM, in which a plurality of memory cells are connected in series to constitute a NAND cell unit, may be formed with a high density because it is formed with select transistors less than a NOR-type EEPROM.

Data erase of the NAND-type EEPROM is usually performed by a block, and data write is by a page (for example, refer to Published and Unexamined Japanese Patent Application No. 2000-76882).

Data read is performed by: applying a read voltage to a control gate of a selected memory cell for judging threshold thereof; simultaneously applying a pass voltage to control gates of the remaining unselected memory cells which is higher than the read voltage and turns on the unselected memory cells without regard to cell data thereof; and detecting a "read current" flows through the NAND cell unit. However, even if selected memory cell's data are the same, these read currents are different from each other in accordance with the data states of the unselected memory cells and the position of the respective selected memory cells in the NAND cell unit. Further, since data read is based on detecting the charge amount flowing through the memory cells, there is a problem that the memory cell's threshold voltage appears to be varied.

It will be explained in detail referring to drawings that the read current appears to be different in accordance with the data states of the unselected memory cells and the selected cell's position. FIGS. 18A and 18B show two data read bias conditions different from each other with respect to a NAND cell unit NU constituted by sixteen memory cells connected in series. One end of the NAND cell unit NU is coupled to a data transfer line (hereinafter, referred to as a bit line) BL via a select transistor S1, and the other to a reference potential line (hereinafter, referred to as a common source line) SL disposed common to the memory cell array via another select transistor S2. Control gates of the memory cells are connected to different data control lines (hereinafter, referred to as word lines) WL, respectively, and gates of the select transistors S1 and S2 are connected to select gate lines SSL and GSL, respectively, for selecting a block.

Although only one NAND cell unit NU is shown in FIGS. 18A and 18B, a plurality of NAND cell units are arranged in the bit line direction and in the word line direction to constitute a memory cell array. A sense amplifier/data latch is coupled to the bit line BL. In case of a flash memory, an assemblage of NAND cell units arranged in the direction of word lines is defined as a block which serves as a unit of data erase. Note that a low threshold state obtained by releasing electrons of the charge storing layer is referred to as a data "1", and a high threshold state obtained by injecting electrons into the charge storing layer as a data "0", in the explanations described bellow.

FIGS. 18A and 18B show voltage relationships at a read time when a memory cell M0 nearest to the bit line BL is selected in the memory cells M0 to M15. As shown in FIGS. 18A and 18B, the source line SL is set at ground potential GND; the bit line BL is applied with a positive voltage VBL, for example, about 1V; the selected word line WL0 is applied with a read voltage Vr for judging data; the remaining unselected word lines WL1–WL15 are applied with a pass voltage Vread which is necessary to turn on cells without regard to these cells' data; and select gate lines SSL and GSL are applied with the pass voltage Vread.

FIG. 20 shows an example of cell data threshold voltage distributions in case of binary data storing. The upper limit of "0" data threshold voltage distribution, Vthw, is, for example, about 2V; the upper limit of "1" data threshold voltage distribution (i.e., erase state), Vthe, is, for example, about −1V. Therefore, a voltage selected in a range of 4V to 5V is used as the pass voltage Vread; and for example, 0V is selected as the read voltage Vr. FIG. 20 shows a threshold voltage distribution of the select transistors S1 and S2, which is lower than the upper limit Vthw of the write threshold voltage. Therefore, apply the pass voltage Vread to the select gate lines, and the select transistors S1 and S2 become conductive with a conductance value larger than those of memory cells.

FIG. 18A shows a case where data of the selected memory cell M0 is "1"; and the entire unselected memory cells M1–M15 are also storing data "1". In contrast to this, in case of FIG. 18B, data of the selected memory cell M0 is "1"; and the entire unselected memory cells M0–M15 are storing data "0". In these cases, the read currents ID1 and ID2 flowing through the respective NAND cell units are satisfied with a relationship of: ID1>ID2. The reason of this is in a fact that on-resistances between sources and drains of the respective unselected cells in the case of FIG. 18B are higher than those in the case of FIG. 18A.

FIGS. 19A and 19B show voltage relationships at a read time when a memory cell M15 nearest to the common source line SL is selected in the memory cells M0 to M15. FIG. 19A shows a case where the entire memory cells store data "1". In contrast to this, in case of FIG. 19B, data of the selected memory cell M15 is "1"; and the entire unselected memory cells M0–M14 are stored with data "0". Although, in these cases, memory cells M0–M14 operate in an active region (i.e., linear operation region) when the bit line voltage VBL is lower than Vread-Vthw, series resistance thereof in case of FIG. 19B becomes larger than that in case of FIG. 19A. Further, since the selected memory cell M15 operates in a linear operation region, the source-drain voltage is small. Therefore, the read currents ID3 and ID4 in case of FIGS. 19A and 19B are satisfied with a relationship of: ID3>ID4.

Considering a substrate bias effect for the respective memory cells, the threshold voltage of the memory cell M0 nearest to the bit line BL, a substrate bias applied to which is higher than that applied to the memory cell M15 nearest to the common source line SL, becomes higher than that of the memory cell M15. Therefore, ID2 is smaller than ID4, while ID1 is smaller than ID3.

So far, it has been explained that the read current of the NAND cell unit varies in accordance with the write data states of the NAND cell unit. This means that a data threshold voltage of a memory cell becomes different between before and after data writes into other memory cells. Explaining in detail, the above-described threshold variation will occur in case of proceeding erase, read and write sequences shown in, for example, FIG. 21 or FIG. 22.

In FIG. 21, firstly, the entire memory cells M0–M15 in the NAND cell unit are erased at a time into a "1" data state (step SE1). Then at step SE2, read the memory cell M0 under the bias condition shown in FIG. 18A. In detail, the cell data is judged as "0" or "1" based on a constant judging current Ith. Alternatively, another read scheme may be used in such a manner that precharging the bit line BL to VBL to let it be floating; and then sensing bit line voltage with a sense amplifier. Further, write "0" data into memory cells from M1 to M15, and cause threshold voltages thereof to be higher (step SE3). Next, at step SE4, read the memory cell M0 under the bias condition shown in FIG. 18B so as to judge whether the data is "0" or "1" based on the judging current Ith.

With this proceeding, in spite of the memory cell M0 is in the same erase state at steps SE2 and SE4, the read currents ID1 and ID2 are different from each other as described with FIGS. 18A and 18B, and this may lead to a situation that the read current ID2 at the step SE4 is less than the judging current Ith; and the read current ID1 at the step SE2 is greater than the judging current Ith. Explaining in other words, "1" data threshold voltage at step SE4 appears to be higher in the positive direction than that at step SE2 in spite of that data read is performed with the same judging current. That is, as shown in FIG. 20 by a dotted line and a solid line, it is generated a situation that "1" data shows two threshold distributions different from each other in appearance.

In FIG. 22, firstly, the entire memory cells M0–M15 in the NAND cell unit are erased at a time into a "1" data state (step SE1). Then at step SE2', read the memory cell M15 under the bias condition shown in FIG. 19A. In detail, the cell data is judged as "0" or "1" based on a constant judging current Ith. Further, write "0" data into memory cells from M0 to M14, and cause threshold voltages thereof to be higher (step SE3'). Next, at step SE4', read the memory cell M15 under the bias condition shown in FIG. 19B so as to judge whether the data is "0" or "1" based on the judging current Ith.

With this proceeding, in spite of the memory cell M15 is in the same erase state at steps SE2' and SE4', the read currents ID3 and ID4 are different from each other as described with FIGS. 19A and 19B, and this may lead to a situation that the read current ID4 at the step SE4' is less than the judging current Ith; and the read current ID3 at the step SE2' is greater than the judging current Ith. Explaining in other words, "1" data threshold voltage at step SE4' appears to be higher in the positive direction than that at step SE2' in spite of that data read is performed with the same judging current. That is, as shown in FIG. 20 by a dotted line and a solid line, it is generated a situation that "1" data has different threshold voltage distributions from each other in appearance.

On the other hand, if the read current of a logical data varies in accordance with a selected memory cell' position and data states of unselected memory cells, it becomes difficult to shorten a read time and reduce electro-magnetic noises due to the read current. This is because that the maximum read time is determined by a condition as the read current of the selected cell becomes minimum, and the maximum electromagnetic noise is determined by a condition as the read current of the selected cell becomes maximum.

Further, as the read current of the selected cell becomes larger, the common source line SL is more boosted in potential, and this leads to a trouble that "0" data write is not sufficiently done in case write and verify-read are repeated (for example, refer to Published and Unexamined Japanese Patent Application No. 11-260076). In addition, the larger the read current, the larger the maximum drain current which flows into the bit line, and this brings wiring resistance increase and reliability deterioration due to electro-migration based on current stress, and transistor threshold variation and leakage current increase due to heat up.

Further, as the judging threshold voltage of "1" data becomes higher, the voltage gap between the lower limit of "0" data threshold voltage distribution (i.e., Vthw2 in FIG. 20) and the upper limit of "1" data threshold voltage distribution (i.e., Vthe in FIG. 20) becomes less. This leads to increasing the probability of erroneous read such as to read out "1" data as "0" data. To prevent such the erroneous read, it may be required to, for example, to bring the "0" data threshold voltage distribution to a higher voltage range. However, this leads to another problem.

The data retention property is so influenced by the self electric field due to the stored charge that the retention of "0" data with a higher threshold voltage distribution is inferior to that of "1" data with a lower threshold voltage distribution. Therefore, if the "0" data threshold voltage distribution is brought to a too high voltage range, it becomes difficult to secure a sufficient data retention property.

In addition, unselected memory cells in the NAND cell unit are applied with a voltage higher than the upper limit of "0" data threshold distribution at a data read time, thereby brought in a weak write mode. Therefore, repeating the data read operation, the threshold voltage(s) of the erase state cell(s) in the unselected memory cells is boosted due to negative charge injection into the charge storing layer(s). This causes data disturbance, erroneous read and the like.

There have already been provided by us some schemes of reducing the read stress on the unselected memory cells due to that the read current varies in accordance with data states of the unselected memory cells and the selected cell's position (refer to Published and Unexamined Japanese Patent Application No. 2002-358792). According to one scheme, considering the drain conductance of the selected memory cell, the pass voltage applied to unselected memory cells is exchanged in accordance with the position of a selected memory cell in a NAND cell unit. Alternatively, another scheme is to use different two pass voltages such as one is applied to unselected memory cells located on the drain side of a selected memory cell; and the other is applied to unselected memory cells located on the source side of a selected memory cell.

SUMMARY OF THE INVENTION

According to an aspect of the present invention, there is provided a semiconductor device including a memory cell unit with a plurality of electrically rewritable memory cells connected in series, two ends thereof being coupled to a data transfer line and a reference potential line via select transistors, respectively, wherein the device has a data read mode defined as to detect a read current flowing between the data transfer line and the reference potential line, and judge data of a selected memory cell in the memory cell unit under the condition of: applying a read voltage to the selected memory cell, the read voltage being set to turn on or off the selected memory cell in accordance with data thereof; applying a pass voltage to remaining unselected memory cells, the pass voltage being set to turn on the remaining unselected memory cells without regard to data thereof; and making the select transistors on, and wherein in the data read mode, the more unselected memory cell or cells located on the source side of the selected memory cell, the higher the pass voltage applied to the unselected memory cell or cells located on the source side of the selected memory cell.

BRIEF DESCRIPTION OF THE DRAWINGS

FIGS. 19A and 19B show other voltage application states at data read times in a conventional flash memory.

DETAILED DESCRIPTION OF THE EMBODIMENTS

Illustrative embodiments of this invention will be explained with reference to the accompanying drawings below.

In the embodiments set forth below, the term "on" of a transistor (i.e., MISFET) refers to a state that the channel between source and drain is electrically conductive by application of a gate voltage higher than the threshold voltage of the transistor. The term "off" of a transistor refers to a state that the channel between source and drain is electrically nonconductive and thus shut off be application of a gate voltage lower than the threshold voltage of the transistor. The "threshold" should be interpreted to mean a gate voltage at which a current flowing between source and drain becomes equal to: 40nA×(channel width)/(gate length).

Note that in the embodiments below, the logic levels are equivalent to those of CMOS logic circuitry employing a CMOS inverter formed of an NMOS transistor with a positive threshold voltage and a PMOS transistor with a negative threshold voltage. Except as otherwise provided in the description, the logic "H" is a level within a range of positive voltages higher than the threshold voltage of a CMOS inverter or an NMOS transistor (for example, ranging from 0.5 to 15V), whereas the logic "L" is a level lower than this range. Although in the embodiments state below the voltage value corresponding to "H" and "L" are sometimes indicated by "Vcc" and "GND" (or "Vss"), respectively, these may any voltages that fall within a range of from Vcc/2 to Vcc and a range of Vcc/2 to 0V, respectively, where Vcc is a power supply voltage.

Even when using transistors with negative threshold voltages, these transistors are designed so that the threshold voltage falls within a variable range of the gate voltage.

Embodiment 1

Figure 1:
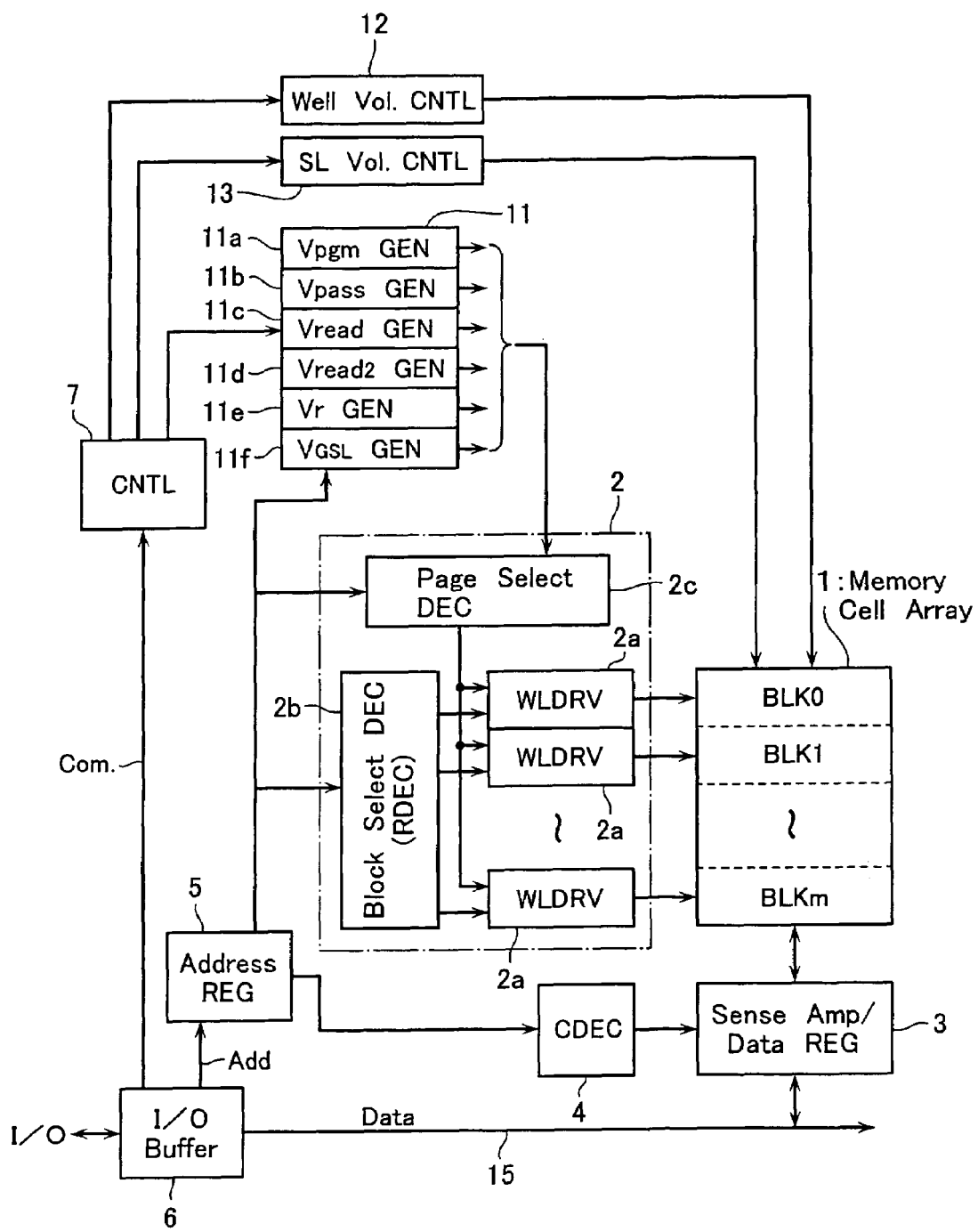
FIG. 1 is a diagram showing a functional block of a flash memory in accordance with an embodiment of the present invention.
Figure 2:
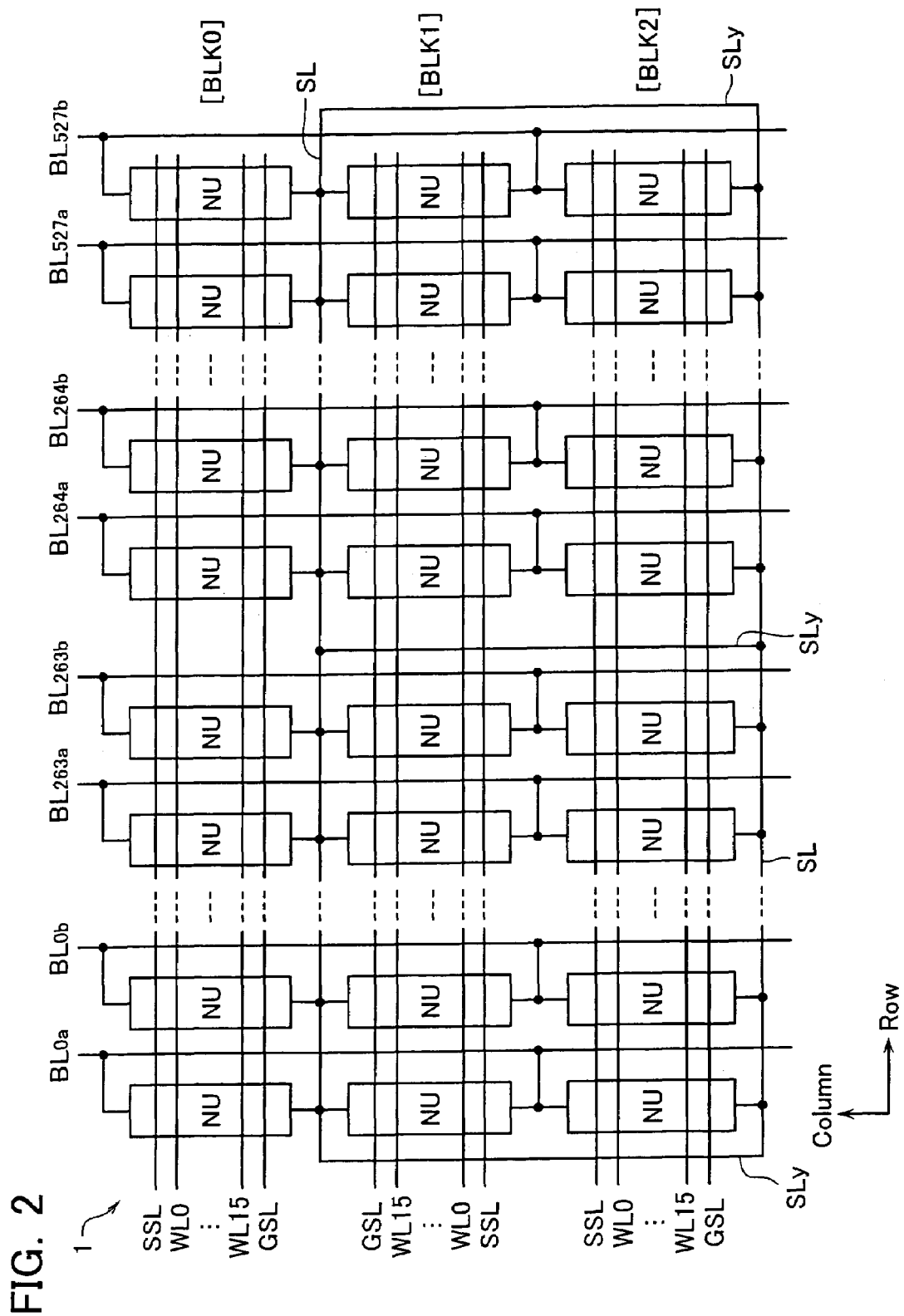
FIG. 2 is a diagram showing a memory cell array of the flash memory.
Figure 3:
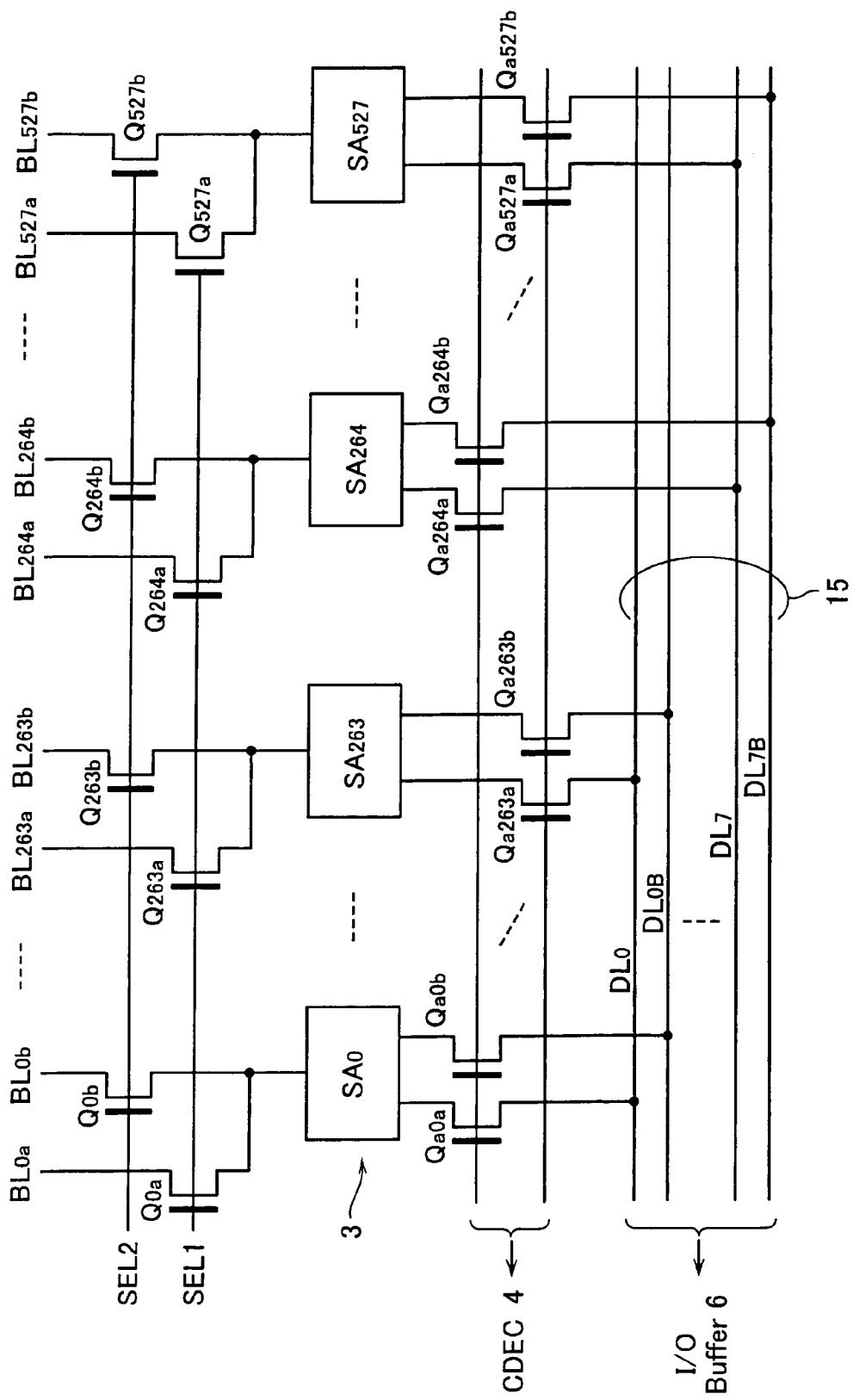
FIG. 3 is a diagram showing a sense amplifier circuit of the flash memory.

FIG. 1 shows a functional block configuration of a NAND-type EEPROM in accordance with an embodiment 1. FIGS. 2 and 3 show the memory cell array 1 and sense amplifier circuit 3 connected to it, respectively. The cell array 1 is formed of memory cell units (i.e., NAND cell units) NU arranged in row and column directions, each of which has a plurality of memory cells connected in series.

Each NAND cell unit NU is connected between a data transfer line BL (refers to as a "bit line" hereinafter) elongated in the column direction and a reference potential line SL (refers to as a "common source line" hereinafter) elongated in the row direction. Data control lines (refers to as "word lines" hereinafter) WL(WL0–WL15) for selectively driving memory cells in the NAND cell unit NU and select gate lines SSL, GSL for block selecting are disposed common to the NAND cell units MU arranged in the row direction.

To sense bit line data of the memory cell array 1 and to hold a write data, a sense amplifier circuit 3 is disposed in association with the memory cell array 1. The sense amplifier circuit 3 is formed of, for example, a flip-flop circuit and serves as a data register.

The sense amplifier circuit 3 is coupled to a data input/output buffer 6 via a data bus 15. Connection between the sense amplifier circuit 3 and the data bus 15 is controlled by the output of a column decoder 4 which decodes address data transferred via an address register 5. Based on this control, it becomes possible to write data supplied from data input/output ports I/O into the memory cell array 1, and to read out data of the memory cell array 1 to the ports I/O.

To select memory cells in the memory cell array 1, i.e., to control word lines WL and select gate lines SSL, GSL, a data control line drive circuit (refers to as a "word line drive circuit" hereinafter) 2 is disposed. The word line drive circuit 2 has word line drivers 2a for controlling word lines and select gate lines in the memory cell array 1, a block select decoder (i.e., row decoder) 2b for selecting a block in the memory cell array 1 and a page select decoder 2a for selecting a page in a block.

In this embodiment, word line drivers 2a are disposed in correspondence with the respective blocks in the memory cell array 1. In detail, each of the word line drivers 2a is formed of a group of transfer transistors with a common gate for transferring drive voltages to sixteen word lines and two select gate lines in a block. The page select decoder 2c is a word line voltage control circuit, which is used common to the entire blocks in the memory cell array 1 and serves for assigning various voltages output from an internal voltage generating circuit 11 in accordance with operation modes to the word lines and select gate lines in a block in accordance with input page address.

The output of the page select decoder 2c is input to the entire word line drivers 2a, while one of the common gates of the word line drivers 2a is selectively driven by output of the block decoder 2c. As a result, a selected word line driver 2a is activated such that the control voltages output from the page select decoder 2c, which are to be applied to a selected word line, unselected word lines and select gate lines, are transferred to the corresponding word lines and select gate lines in a selected block via the word line driver 2a.

As described above, in this embodiment, plural blocks share the page select decoder 2c, which serves for selecting a word line in a block, whereby the circuit area of the word line drive circuit 2 may be lessened.

Well voltage control circuit 12 is disposed for controlling a voltage of the cell array substrate area (usually, p-type well) on which the cell array 1 is formed. In detail, the well voltage control circuit 12 is configured to be controlled by the controller 7 to generate ground potential GND in data write mode and data read mode, while generate an erase voltage higher than 10V in an erase mode.

Internal voltage generating circuit 11 is configured to generate various internal voltages under the control of the controller 7, which are required to be applied to selected memory cells in the memory cell array 1 in data write or data read mode. In detail, the internal voltage generating circuit 11 has Vpgm generator 11a for generating a write voltage (Vpgm), Vpass generator 11b for generating a write pass voltage (Vpass), Vread generator 11c for generating a first read pass voltage (Vread1), Vread2 generator 11d for generating a second read pass voltage (Vread2), Vr generator 11e for generating a read voltage (Vr) applied to a selected memory cell and VGSL generator 11f for generating a control voltage (VGSL) applied to a select gate transistor. It is a feature in this embodiment that two types of read pass voltage generators, i.e., Vread generator 11c and Vread2 generator 11d.

Vpgm generator 11a generates a write voltage Vpgm boosted to be higher than power supply voltage Vcc, which is applied to a control gate of a selected memory cell (i.e., selected word line) in a data write mode. Vpass generator 11b generates a pass voltage Vpass higher than Vcc and lower than Vpgm, which is applied to control gates of unselected or non-selected memory cells (i.e., unselected or non-selected word lines) in a data write mode.

Vread generator 11c generates a pass voltage Vread1 higher than Vcc, which is applied to control gates of unselected or non-selected memory cells (i.e., unselected or non-selected word lines) located on the drain side (i.e., bit line BL side) of a selected memory cell in a data read mode. Vread2 generator 11d generates a pass voltage Vread2 higher than Vcc, which is applied to control gates of unselected memory cells (i.e., unselected word lines) located on the source side (i.e., source line SL side) of a selected memory cell in a data read mode.

It is a basic feature of this embodiment that the pass voltage Vread2 applied to unselected memory cells located on the source side of a selected memory cell is changed in level in accordance with the position of the selected memory cell in a NAND cell unit. In addition to this, in this embodiment, the pass voltage Vread1 applied to unselected memory cells located on the drain side of a selected memory cell is also changed in accordance with the position of the selected memory cell in a NAND cell unit. Methods of setting these pass voltages Vread1 and Vread2 will be described later. To generate these two types of read pass voltages Vread1 and Vread2 in accordance with the position of a selected word line in a NAND cell unit as described above, word line selection address (i.e., page address) will be input to Vread generator 11c and Vread2 generator 11d.

Vr generator 11e generates a read voltage Vr applied to a control gate of a selected memory cell (i.e., selected word line) for judging a cell threshold voltage in a read mode. VGSL generator 11f generates a select voltage VGSL applied to gates of select gate transistors (i.e., select gate lines) in a data read mode. This voltage VGSL is set to be equal to or lower than the pass voltages Vread1 and Vread2. In case the voltage VGSL is set to be lower than Vcc, a boost circuit serving as VGSL generator 11f may be omitted. This leads to lessen the memory chip size and decrease the electric field applied to select transistors so as to improve reliability of the memory.

Alternatively, it is preferable to form the VGSL generator 11f as an internal power supply circuit which may be programmed after having produced the memory chip. By use of such the circuitry, it is possible to adjust the voltage VGSL for each chip even if there are threshold voltage variations among chips. For example, fuse circuits or non-volatile memory devices are formed for selecting some voltages in VGSL generator 11f. These fuse circuits or non-volatile memory devices are cut or programmed based on data with respect to the amount of threshold voltage variations measured for each chip before memory shipment. By use of such the scheme, it is possible to adjust the voltage VGSL after wafer dicing. Alternatively, it is effective for suppressing the variations among chips to supply the voltage VGSL from exterior without the above-described internal power supply circuit.

Write voltage Vpgm is, for example, selected in a range of 6V to 30V. Write pass voltage Vpass is one in a range of 3V to 15V, while read pass voltages Vread1 and Vread2 are in a range of 1V to 9V. These read pass voltages are ones necessary for turning on memory cells without regard to cell data. In detail, it is desirable for sufficiently securing read out cell current and for preventing from data disturbance that these read pass voltages Vread1 and Vread2 are set to be higher than the upper limit of "0" write threshold voltage by about 1V to 3V. Setting schemes of these read voltages Vread1 and Vread2 will be explained in detail later. Read voltage Vr is set at an intermediate point in the separating voltage range defined between "1" and "0" threshold distributions.

Source line voltage control circuit 13 is controlled by controller 7 so as to drive the common source line SL, which is a reference potential line in the memory cell array 1, in accordance with write, read and erase modes.

Controller 7 decodes command "Com." supplied from the external input/output ports I/O to control read, write and erase operations, and distinguish between address "Add." and data "Data" supplied from exterior to transfer them to predetermined circuit portions. Therefore, controller 7 sends control signals to I/O buffer 6, address register 5, sense amplifier circuit 3 and word line drive circuit 2, but these control signal lines are omitted in FIG. 1.

As described in detail later, sixteen word lines WL0–WL15, which select sixteen memory cells in a NAND cell unit NU, are shared by the entire NAND cell units arranged in the row direction as shown in FIG. 2. Select gate lines (i.e., block select lines) SSL and GSL are also shared by the entire NAND cell units NU arranged in the row direction. The detailed configuration of the NAND cell unit NU will be explained later.

An assemblage of NAND cell units arranged along a word line is defined as a block BLK which serves as a unit of data erasure. An assemblage of memory cells arranged along a word line is defined as a page (or two pages) which serves as a unit of data read and write. In the example shown in FIG. 2, three blocks BLK0–BLK2 are arranged in the column direction (i.e., in the direction of bit lines), and 2×528 NAND cell units are arranged in the row direction (i.e., in the direction of word lines). This is only an example. In general, a plurality of NAND cell units and blocks may be arranged.

Bit lines BLxa, BLxb (x=0, 1, . . . ,527) are disposed to cross the word lines WL so as to be shared by plural NAND cell units NU arranged in the column direction. Common source lines SL are elongated in the row direction to be common to plural NAND cell units NU. To connect between source lines SL, short-circuit lines SLy are disposed in the column direction so as to form a net structure with the common source lines SL. This prevents the common source lines SL from being pulled-up in potential due to read current. Since the lines SLy are formed of the same conductive layers as diffusion layers or bit lines in the memory cell array 1, it is impossible to dispose memory cells on the area of these lines SLy. Therefore, the density of bit lines is set to be higher than that of lines SLy so as to secure a sufficient cell area in the chip.

Although the short-circuit lines SLy are disposed every 528 bit lines in the example shown in FIG. 2, the number of bit lines disposed for each short-circuit line SLy may be optionally selected. The common source line SL is electrically connected to a source line voltage control circuit 13. This circuit 13 is one for generating ground potential GND in a data read mode.

Either of bit lines BLxa and BLxb is selected by bit line select transistors Qxa or Qxb to be coupled to each sense amplifier SAx in the sense amplifier circuit 3. Since it is required of sense amplifier circuit 3 to use transistors with a size larger than the memory cell, one sense amplifier SAx is disposed for two bit lines BLxa and BLxb in common, whereby the occupied area of the sense amplifier circuit 3 may be reduced.

The gates of bit line selecting transistors Qxa are connected in common in the row direction, and simultaneously driven by a control signal SEL1. As similar to this, the gates of bit line selecting transistors Qxb are connected in common in the row direction, and simultaneously driven by a control signal SEL2. By use of these control signals SEL1 and SEL2, bit line selection in the memory cell array 1 with a high density may be done in a small wiring area.

Although FIG. 3 shows an example that two bit lines are selectively coupled to a sense amplifier, sense amplifiers may be disposed in correspondence with the respective bit lines in case it is permitted according to sense amplifier layout circumstances. Alternatively, one sense amplifier may be disposed common to four bit lines. In general, it is desirable for making a decode circuit design easy that the number of bit lines associated to a sense amplifier is selected as $2^n$ (where, "n" is a natural number).

The sense amplifier circuit 3 serves not only for reading memory cell data as described above, but also as a data register for temporarily store write data to be written into memory cells. The sense amplifier circuit 3 is connected to a data bus 15, which is connected to an I/O buffer 6, via column gate transistors Qaxa, Qaxb controlled by the outputs of the column decoder 4.

The entire sense amplifiers SA in the sense amplifier circuit 3 are simultaneously activated by an activation signal supplied from the controller 7, whereby data read and write of the memory cell array 1 are performed by a page (=528 bit=66 Byte). On the other hand, to do serial data transferring by a byte between the sense amplifier circuit 3 and the data input/output ports I/O, the data bus 15 is formed of eight pairs of complementary data lines DL0, DL0B to DL7, DL7B. In order to decrease the capacitive coupling noise between this data bus and bit lines BL, it is desirable that the data bus 15 is elongated in the row direction so as to cross the bit lines BL at right angles.

Figure 4:
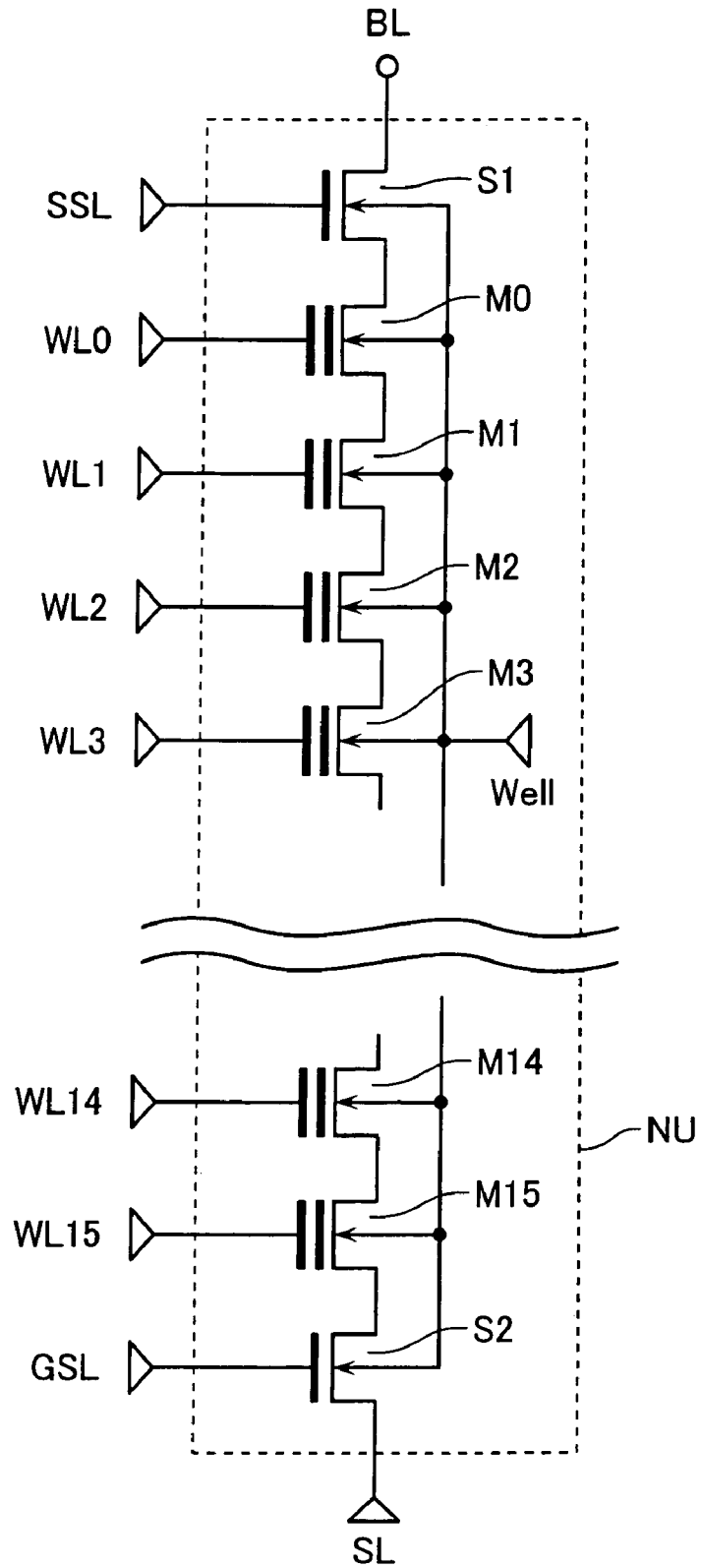
FIG. 4 is a diagram showing an equivalent circuit of the memory cell array.
Figure 5:
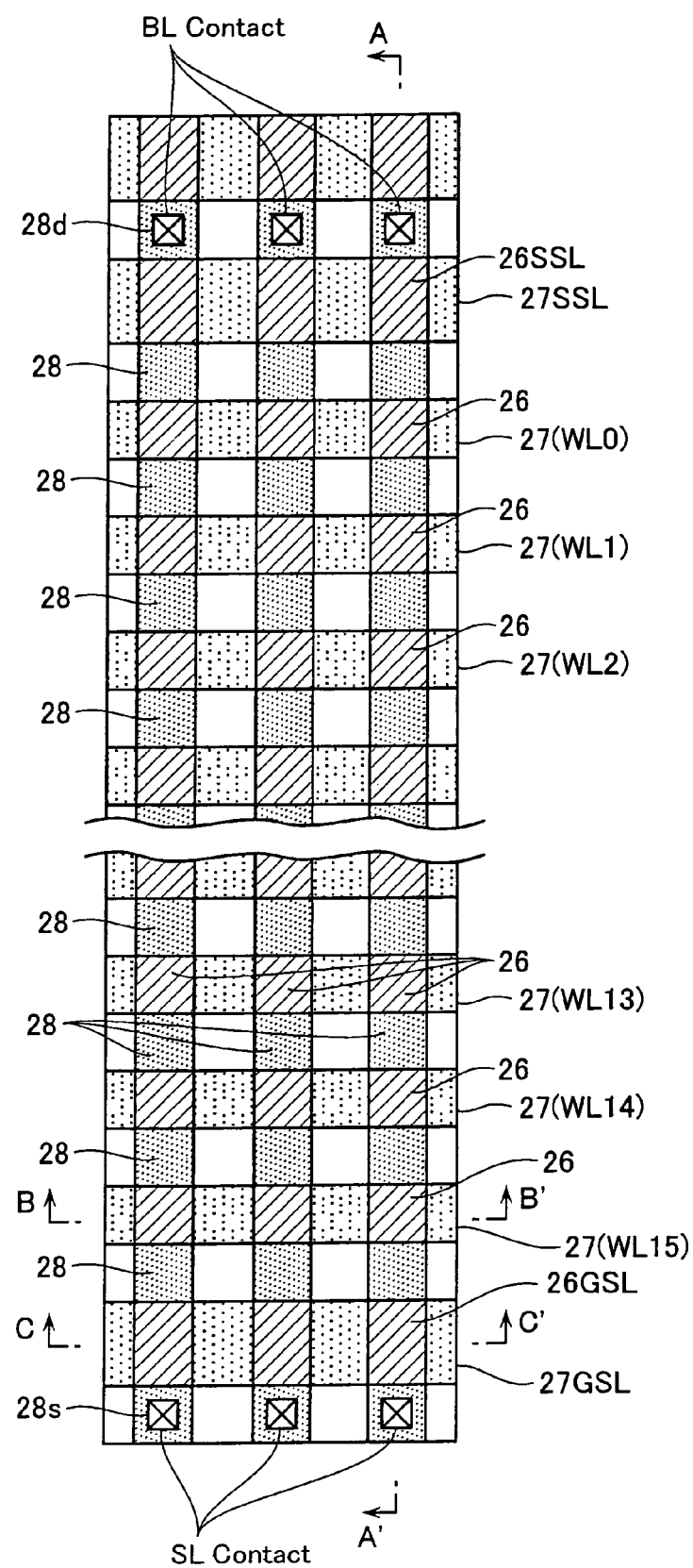
FIG. 5 shows a plan view for three NAND cell units in the flash memory.

FIGS. 4 and 5 show an equivalent circuit of one NAND cell unit NU and a plan view of three NAND cell units, respectively. NAND cell unit NU has non-volatile memory cells M0–M15 connected in series, each of which has a MISFET structure with a floating gate 26 serving as a charge storage layer. One end of the memory cell connected in series is coupled to a bit line BL via a select transistor (MISFET) S1, and the other to the common source line SL via another select transistor (MISFET) S2. Control gates of the memory cells M0–M15 ate connected to word lines (WL0–WL15) 27, respectively. To select one in plural NAND cell units arranged along the bit line BL so as to couple it to the bit line BL, gates of the select transistors S1 and S2 are connected to select gate lines 27(SSL), 27(GSL), i.e., block select lines SSL, GSL, respectively.

The select gate lines SSL and GSL, to which gates of the select transistors S1 and S2 are connected, are formed of the same conductive layers as word lines WL0–WL15, which connect the control gates 27, and floating gates 26 underlying them so as to be elongated in the row direction. Although in this embodiment the cell unit NU arranged to have two select gate transistors, similar results are obtainable with at least one of them provided. Also note that while one specific example with the NAND cell units NU including sixteen ($16=2^4$) memory cells is shown, the number of memory cells in a NAND cell unit may be set as two or more. In general, it is desirable from a view point of address decode design that cell number be set to $2^n$ (where, "n" is a positive integer).

Figure 6A:
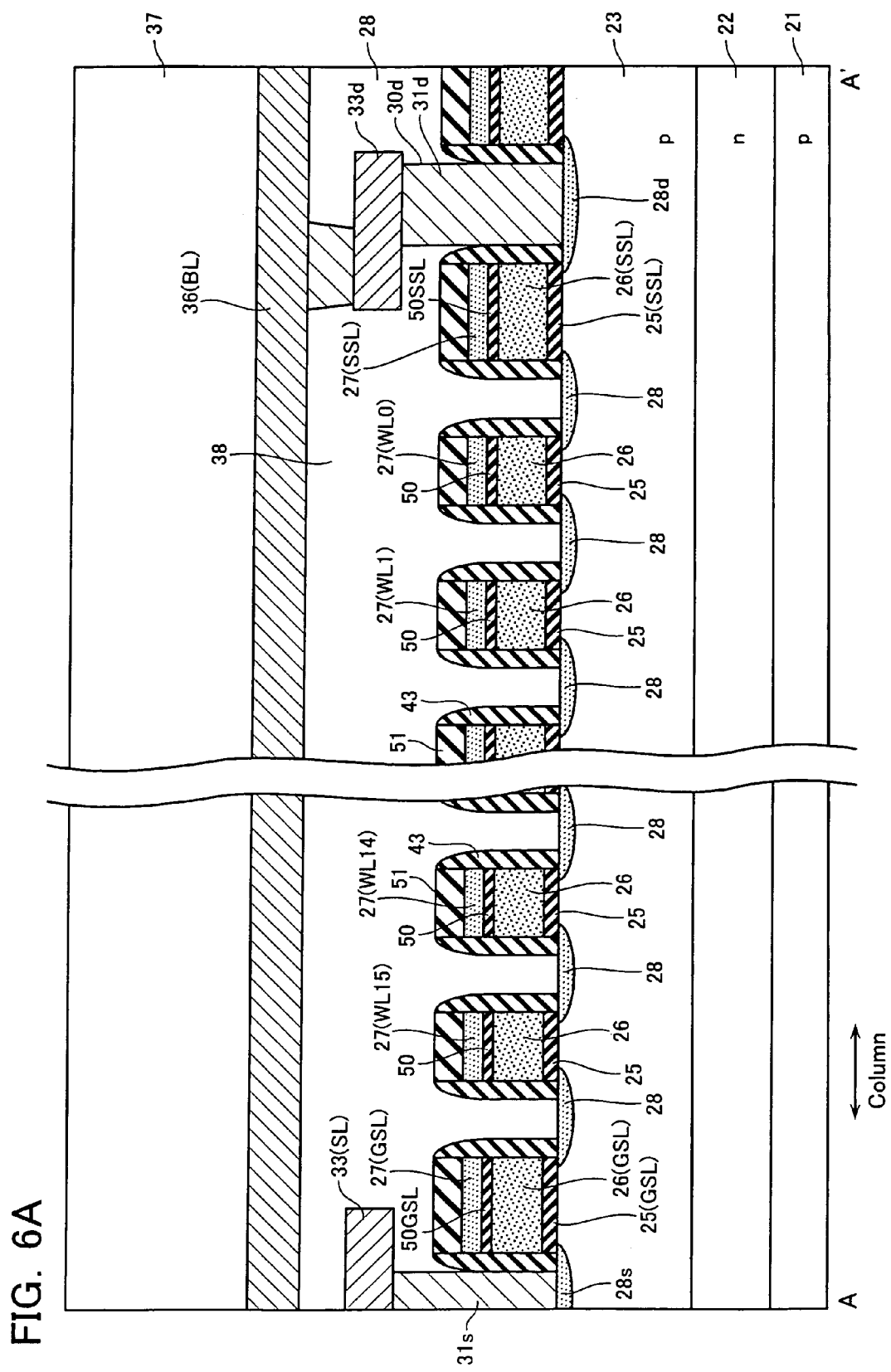
FIGS. 6A, 6B and 6C show sectional views of the NAND cell units taken along lines A-A', B-B' and C-C', respectively, of FIG. 5.
Figure 6B:
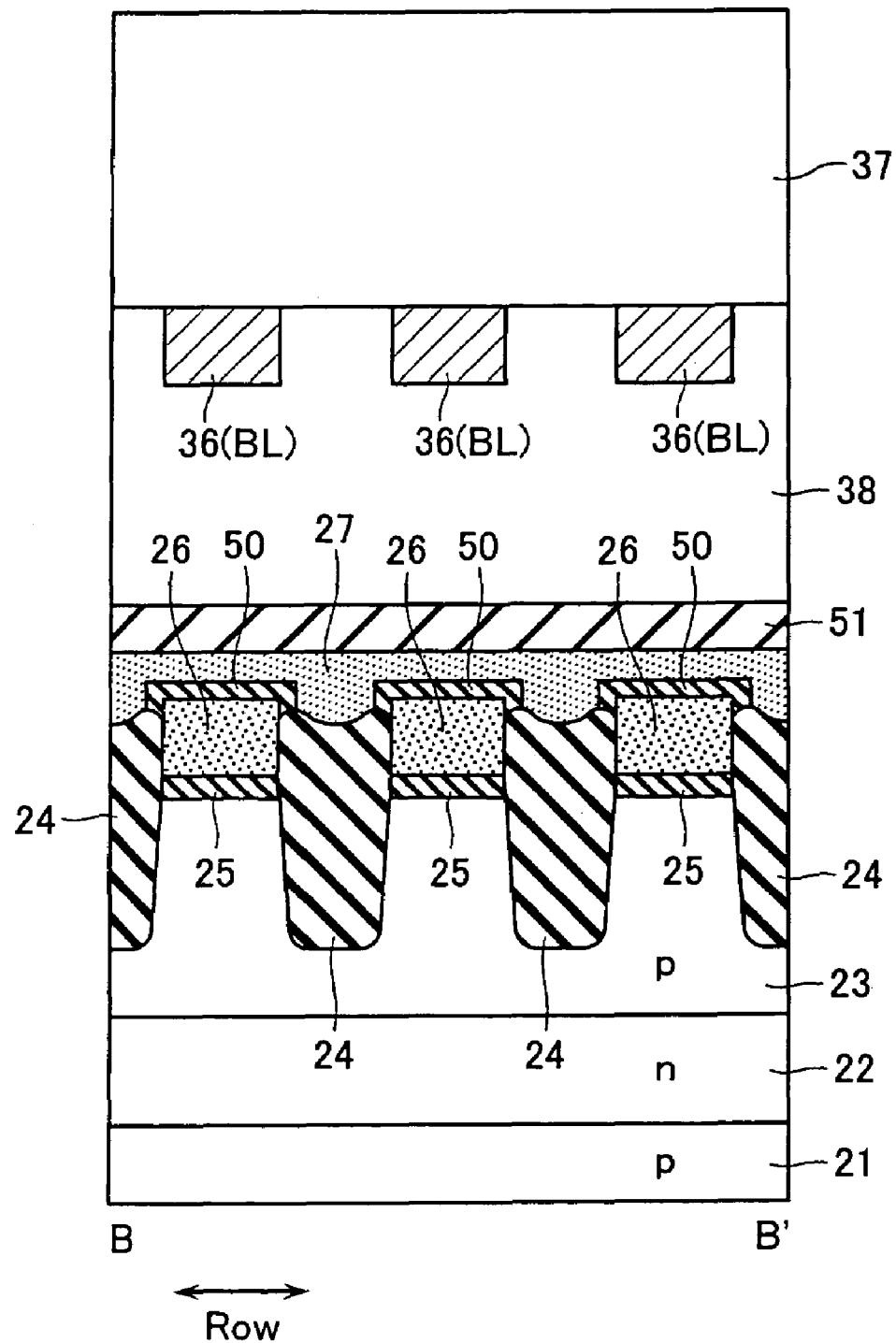
Figure 6C:
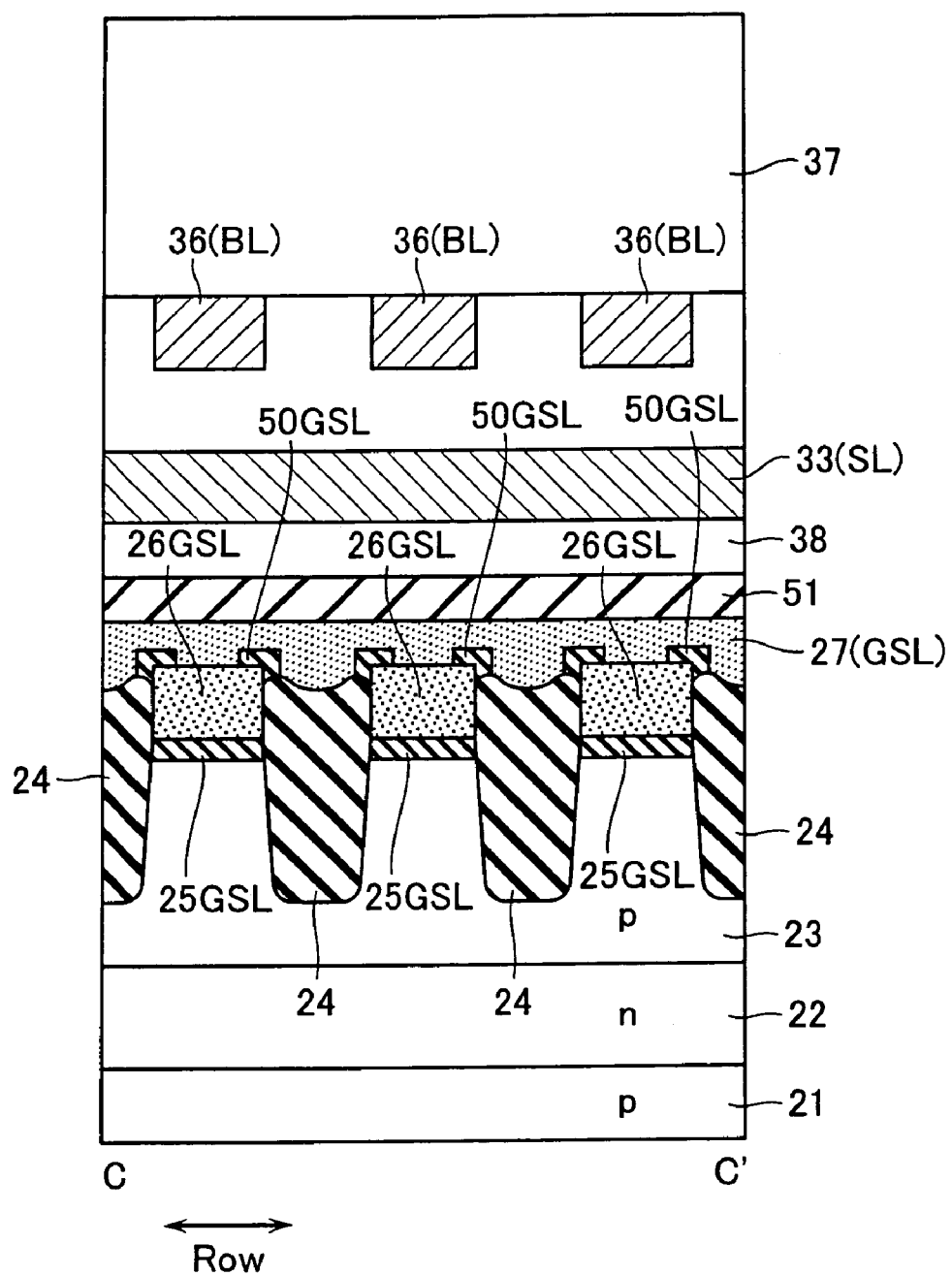

FIGS. 6A, 6B and 6C show cross-sectional views as taken along lines A-A', B-B' and C-C', respectively, in the layout shown in FIG. 5. The cell array is formed on a p-type well 23 formed in an n-type well 22 in a p-type silicon substrate 21. The p-type well 23 is, for example, formed with a boron concentration from $10^{14}$ cm$^{-3}$ to $10^{19}$ cm$^{-3}$. The p-type well 23 is separated from the p-type substrate 21 by the n-type well 22, thereby becoming possible to be applied with a voltage independently from the substrate 21. This leads to reduce the load of boost circuits in an erase mode, and suppress the power consumption.

Floating gates 26 of memory cells and gate electrodes 26(SSL), 26(GSL) of the select transistors S1, S2 are simultaneously formed on the surface of the p-type well 23 with a gate insulating film 25 interposed therebetween. The gate insulating film 25 is formed of silicon oxide film or oxynitride with a thickness of 3 nm to 15 nm. The floating gate 26 and gate electrodes 26 are formed of polycrystalline silicon film with a thickness of 10 nm to 500 nm, in which phosphorous (P) or arsenic (As) is doped to a concentration ranging from $10^{18}$ cm$^{-3}$ to $10^{21}$ cm$^{-3}$. The gate insulating film 25 has a constant thickness in the region of memory cell M0–M15 and select transistors S1, S2.

Each floating gate 26 is formed in an element formation region of the p-type well which is partitioned by an element isolation dielectric film 24 formed of a silicon oxide. This structure is formed by the steps of: depositing the gate insulating film 25 and a gate material film serving as floating gates 26 on the entire surface of the p-type well 23; patterning these films; etching the p-type well 23 with a depth of 0.05 to 0.5 $\mu$m; and burying the element isolation dielectric film 24. By use of such the fabrication process, the floating gates 26 are formed flat without steps in its entirety. Note here that gate electrodes 26(SSL), 26(GSL) are formed with the same material film as the floating gates 26 to be elongated in the row direction of the cell array 1, and serve as select gate lines SSL and GSL.

Control gates 27, 27(SSL), 27(GSL) are formed over the floating gates 26 with a block insulating film 50 interposed therebetween. The block insulating film 50 is formed of any one 5 to 30 nm thick silicon oxide film, oxynitride film and silicon oxide/silicon nitride/silicon oxide film. The control gate 27 are formed of, for example, a 10 to 50 nm thick polysilicon film in which boron or phosphorous is doped to a concentration of $10^{17}$ to $10^{21}$ cm$^{-3}$, or a stack structure of WSi and polysilicon, or another stack structure of polysilicon and any one of NiSi, MoSi, TiSi and CoSi. Control gates 27 are formed continuous in the row direction of the cell array to serve as the word lines WL0–WL15. Similar to this, control gates 27(SSL) and 27(GSL) are formed continuous in the row direction and connected to gate electrodes 26(SSL) and 26(GSL), so as to serve as the select gate lines SSL and GSL.

Since the gate structure is so formed in this embodiment that the sidewall of the p-type well 23 is covered with the insulator film 24 after having formed the floating gate 26, it is possible to prevent the floating gate 26 from being underlay the p-type well. Therefore, it may be avoided that a large electric field is concentrated at the boundary between the p-type well 23 and insulator film 24 or parasitic transistors with a reduced threshold are produced. Further, it is able to suppress the reduction of write threshold due to electric field concentration, whereby high reliable transistors may be formed.

The upper surface of the gate structure is covered with a silicon oxide (or nitride) film 51, and both sidewalls thereof also covered with a sidewall insulator film 43 formed of 5 nm to 490 nm thick silicon nitride (or oxide) film. Source and drain n-type diffusion layers 28 are formed as self-aligned to the gate electrode. These diffusion layers 28, floating gate 26 and control gate 27 constitute a floating gate type EEPROM cell which stores charge in the floating gate as data. The gate length of this cell is set to be 0.01 $\mu$m to 0.5 $\mu$m. The source/drain n-type diffusion layers 28 are formed to have a surface concentration of $10^{17}$ cm$^{-3}$ to $10^{21}$ cm$^{-3}$ with a chosen impurity, e.g., phosphorous, arsenic or antimony, and have a depth of 10 nm to, 500 nm. These diffusion layers are disposed common to adjacent cells to constitute a NAND cell unit.

In this embodiment, the gate electrodes 26(SSL) and 26(GSL) of the select transistors S1 and S2 have a gate length (channel length) longer than that of the memory cell. For example, the gate length is set to be 0.02 $\mu$m to 1 $\mu$m. With this gate length design, it is possible to attain a sufficient ON/OFF ratio between a block selection time and a non-selection time, thereby becoming possible to prevent the memory device from being erroneously read or erroneously written. It is desirable for reducing the fabrication process and cost that these select transistors S1 and S2 have the same gate insulating film 25 as the memory cell.

The NAND cell unit has n-type diffusion layers 28d and 28s at the both ends thereof, one of which, 28d, is connected to an intermediate electrode 33d via a contact plug 30d, and further connected to bit line 36. The bit line 36 is formed of any one of tungsten, tungsten silicide, titanium, titanium nitride, and aluminum to be continuous in the column direction of the cell array. The other diffusion layer 28s is connected to common source line 33 continuous in the row direction of the cell array, which is formed as continuous in the row direction of the cell array with the same material as the intermediate electrode 33d, via contact plug 30s. Alternatively, the common source line 33 may be formed of the same material as the bit line 36. The contact plugs 30d and 30s are made of, for example, impurity-doped polysilicon, tungsten, tungsten silicide, aluminum, titanium, or titanium nitride.

Note here that it is possible to form the n-type diffusion layer 28s as continuous in the row direction of the cell array 1, and use it as the common source line. The upper surface of the bit line BL is covered with an insulative passivation film 37 such as SiO$_2$, SiN, polyimide and the like. Further, there is not shown in the drawings, but upper wirings are formed of W, Al or Cu film above the bit line BL.

In the above-described NAND-type EEPROM, the present invention has a feature in the data read scheme as described later. Data write and erase are performed, for example, as similar to those in the conventional one, based on the scheme disclosed in Published and Unexamined Japanese Patent Application No. 2000-76882. Briefly explaining, data erase is preformed by a block (NAND cell block) in the cell array 1 such as to erase a block in a lump. At the erase time, a boosted erase voltage Vera output from the well voltage control circuit 12 is applied to the p-type well 23 of the cell array, while the entire word lines in a selected block are set at 0V. With this voltage allocation, all memory cells in the selected block are forced to release electrons of the floating gates to the substrate by FN tunneling, and become erased statuses with low threshold voltages (all "1" data status).

At a data write time, apply a certain voltage in accordance with write data, for example, Vcc (in case of "1" write, i.e., write inhibition) or Vss (in case of "0" write) to the bit line BL, and the NAND cell channel is precharged. Having precharged to a high level, the NAND cell channel becomes floating because of the select transistor S2 on the bit line side becomes off. Thereafter, a boosted write voltage Vpgm is applied to a selected word line, and a write pass voltage Vpass to unselected word lines.

With these voltage applications, a high electric field is applied between the selected word lines and the channel set as a low level in a "0" write cell, whereby electrons are injected into the floating gate by FN tunneling, and the cell becomes to have a "0" data state with a high threshold voltage. By contrast, electron injection does not occur in a "1" write cell because of that floating gate thereof, which has been precharged at a high level, is boosted in potential by capacitive coupling. Therefore, the "1" write cell is kept as it is.

Usually, data erase and write are performed with verify-read operations for verifying the erase and write states, respectively. That is, it is in a data erase mode that erase voltage pulse application operation and erase-verify operation are repeated, whereby erased cells are brought to be in a certain erase threshold voltage range. As well as this, in a data write mode, write voltage application and write-verify operation are repeated so as to bring the "1" data cells into a certain threshold voltage range.

Figure 7:
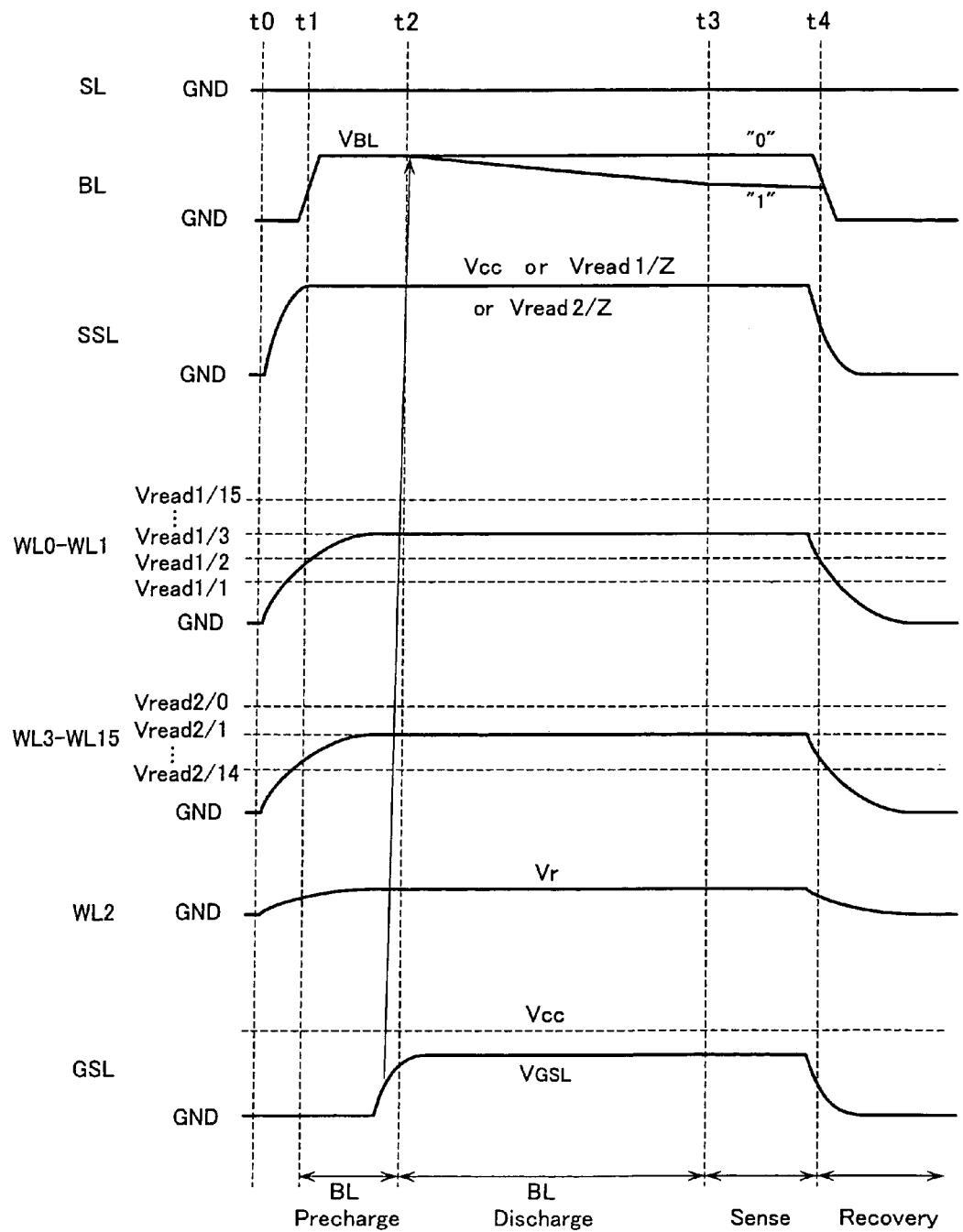
FIG. 7 is a timing chart of a data read operation of the flash memory.

Next, a data read operation in accordance with this embodiment will be explained in detail. FIG. 7 shows a timing chart of a data read operation in which a word line WL2 is selected in a selected block, and a read current is carried from the bit line BL to the common source line CELSRC. FIGS. 8A to 8D show voltage application relationships in the bit line discharging period and the successive sensing period by giving attention to a NAND cell unit NU. FIGS. 8A to 8D show that the positions of the selected cells in the NAND cell unit are different from each other, and write pass voltages Vread1 and Vread2 applied to unselected (or non-selected) word lines are different from each other.

Figure 8A:
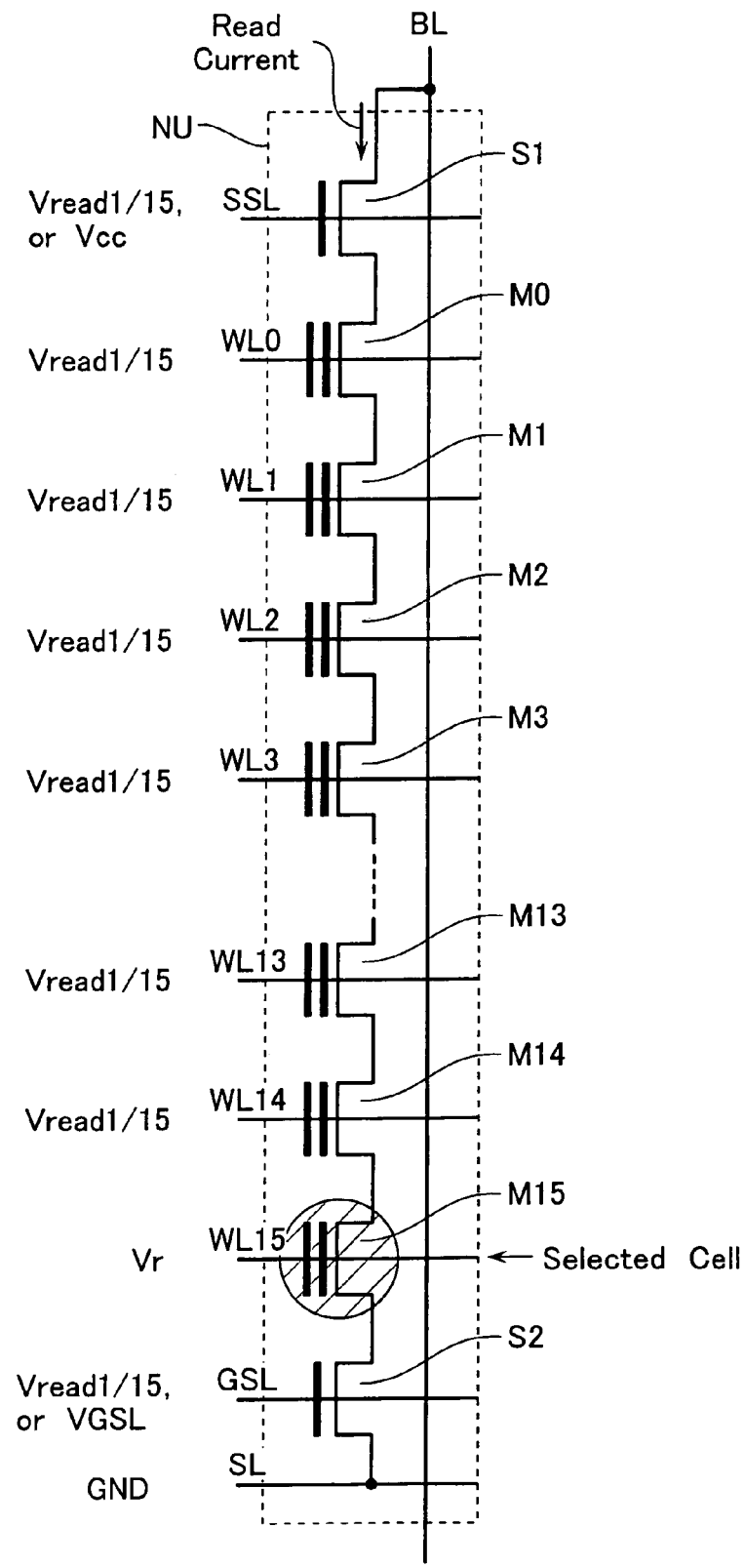
FIGS. 8A to 8D show relationships of voltage application states of the NAND cell unit in case memory cells M15, M13, M2 and M0 are selected, respectively, at a data read time.
Figure 8B:
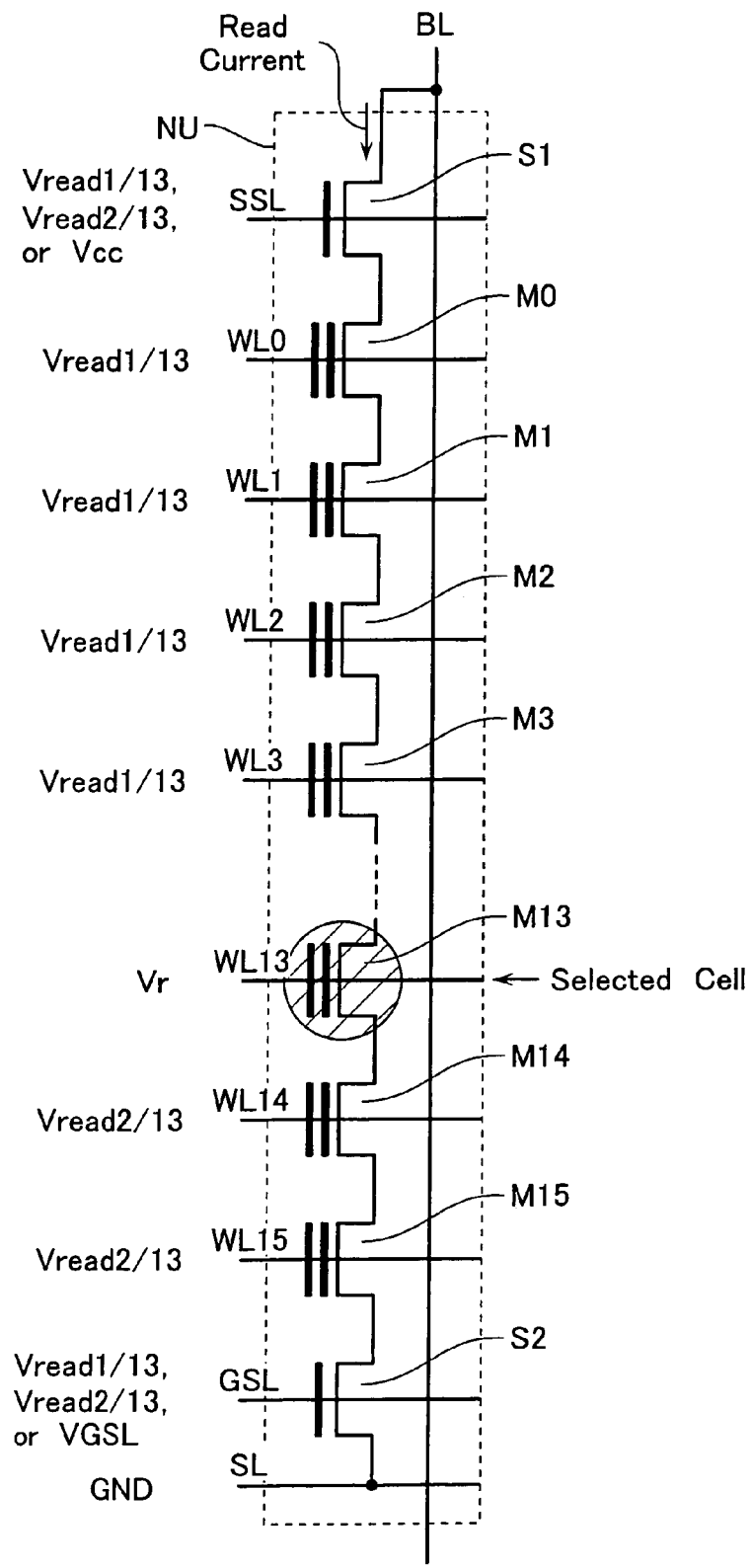
Figure 8C:
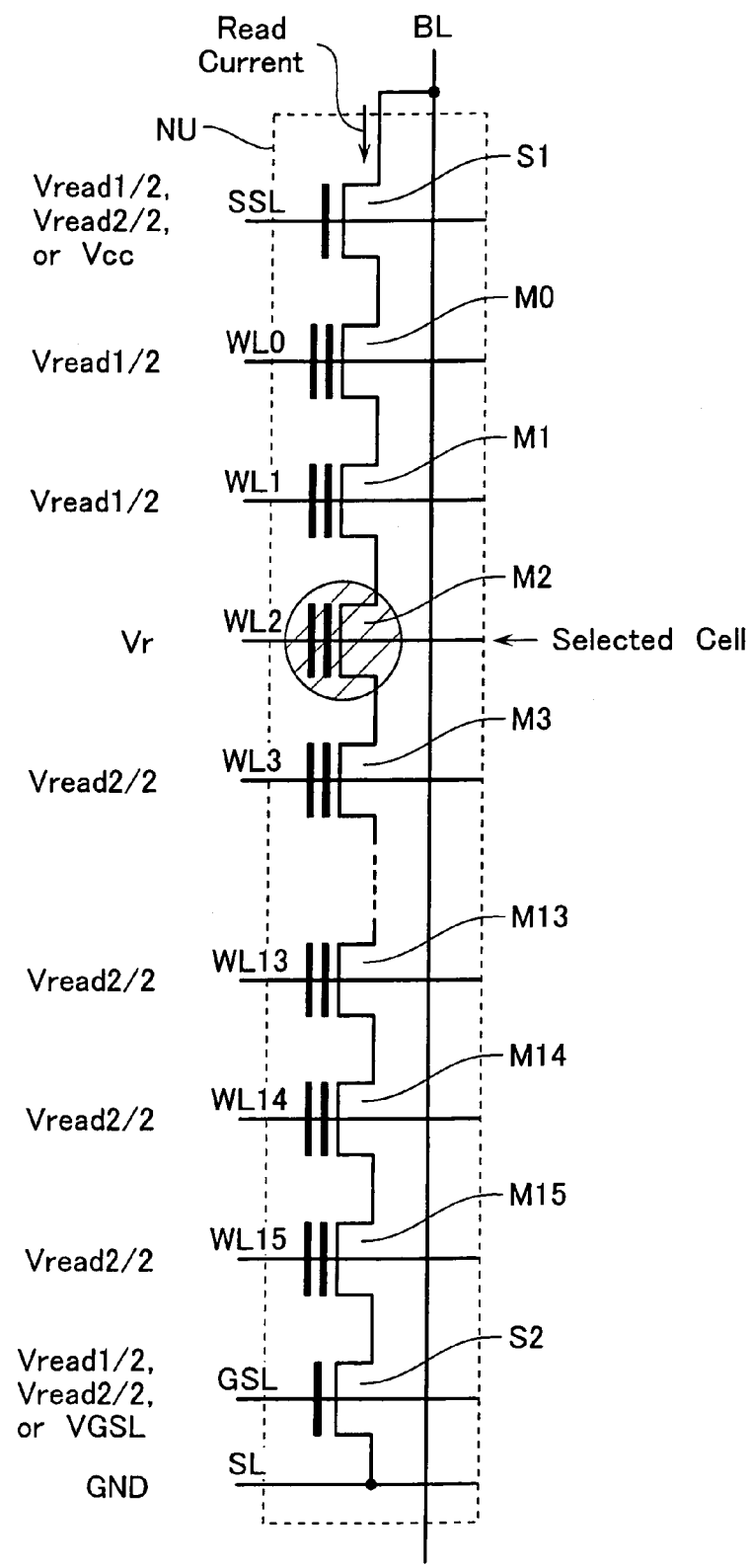
Figure 8D:
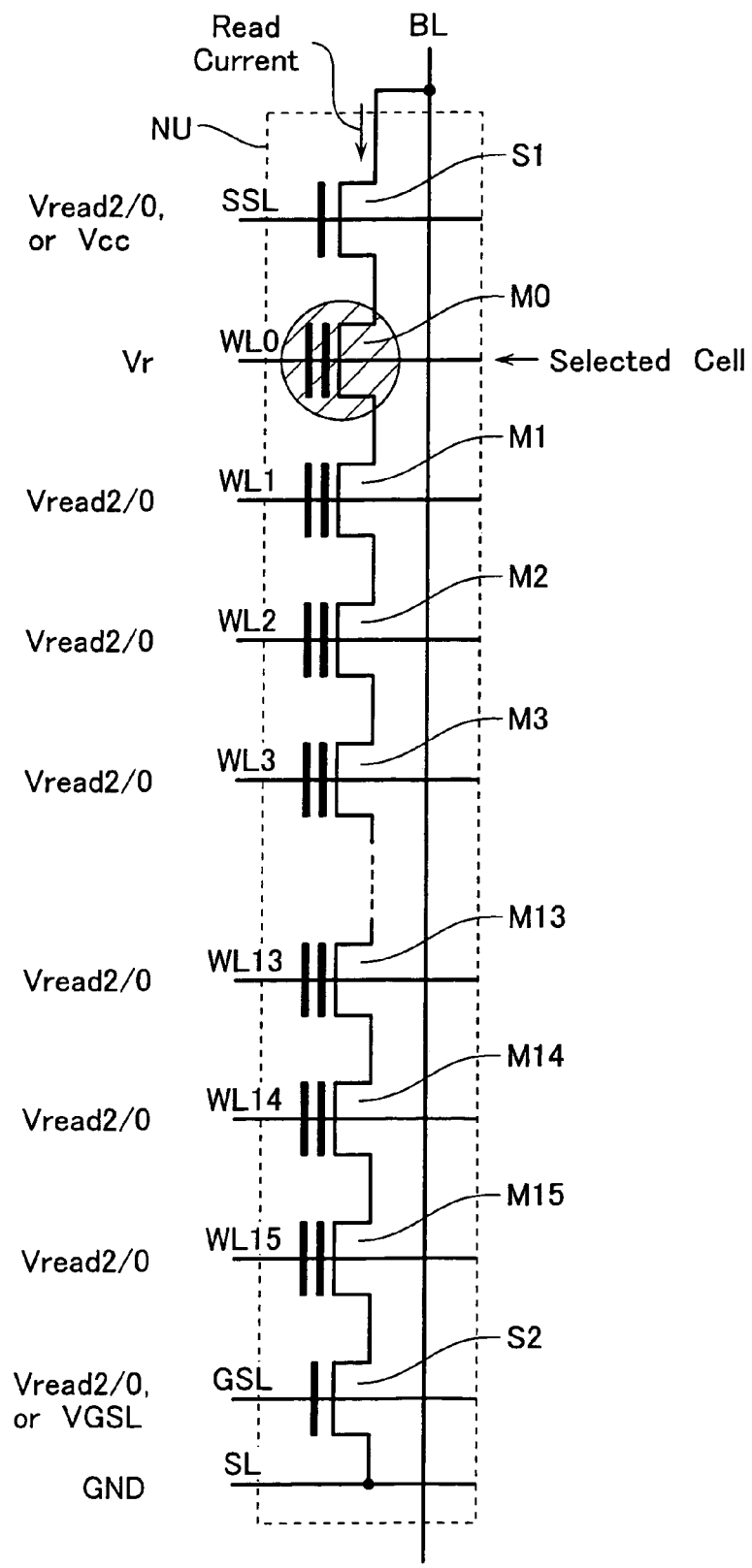

FIG. 7 shows a case that the third memory cell M2 from the bit line BL is selected in the NAND cell unit cell, and this corresponds to the case of FIG. 8C. FIGS. 8A, 8B and 8D show such cases where memory cells M15, M13 and M0 are selected, respectively. These FIG. 7 and FIGS. 8A–8D show that write pass voltages Vread1/z and Vread2/z each changes in value in accordance with a position "z" of the selected word line WLz (z=0, 1, . . . , 15).

At the data read time, a word line driver 2a is activated in correspondence with a selected block selected by the block decoder 2b, and as shown in FIG. 7, Vcc (or pass voltage Vread1/2 or Vread2/2) is applied to the select gate line SSL disposed on the bit line BL side; a read voltage Vr to a selected word line WL2; a pass voltage Vread1/2 to unselected word lines WL0 and WL1 disposed on the bit line side from the selected word line WL2; and a pass voltage Vread2/2 to unselected word lines WL3–WL15 on the source line side, respectively, at timing t0. The select gate line GSL is kept at ground potential GND.

Note here, select gate lines SSL and GSL, and word line WL0–WL15 in unselected blocks are maintained in a floating state or 0V during the data read period such that erroneous data read and data disturbance are prevented.

Figure 12:
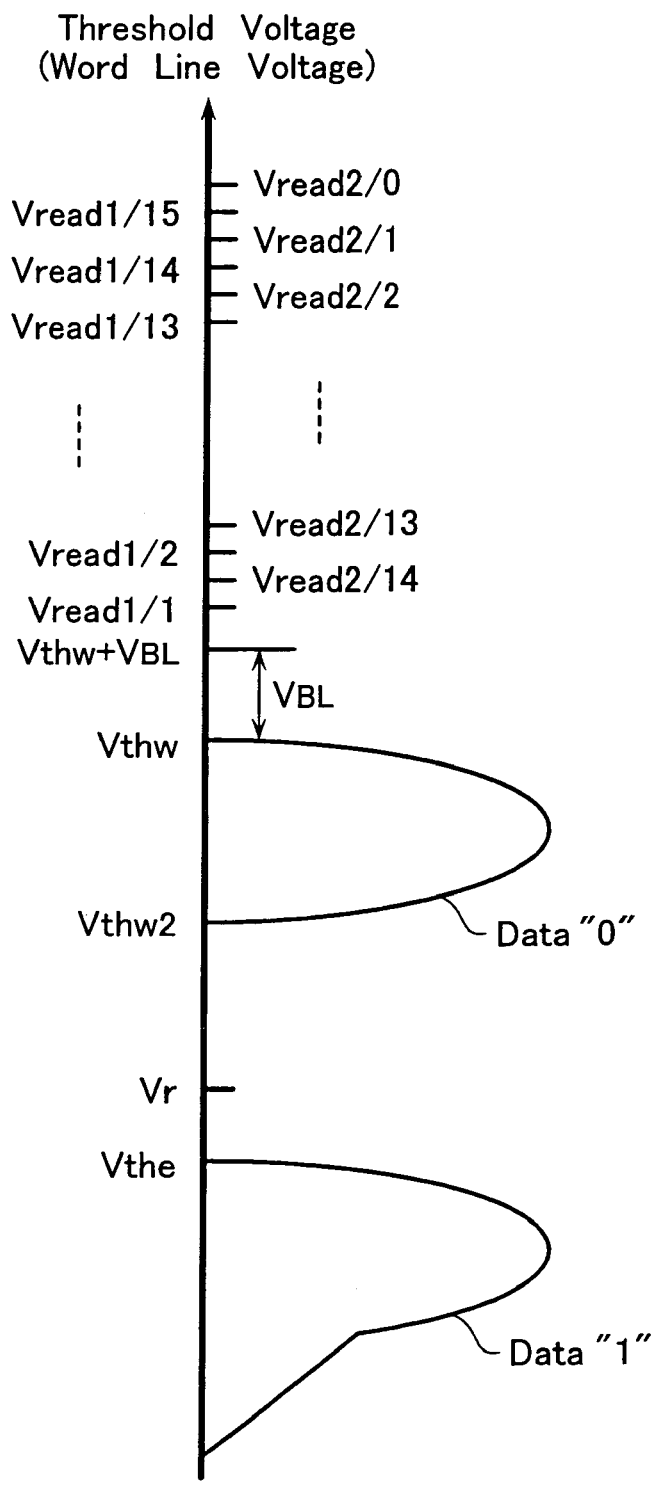
FIG. 12 shows an example of pass voltages set in a data read operation in accordance with this embodiment.

The read voltage Vr is, as shown in FIG. 12, set between the lower limit Vthw2 of "0" data threshold voltage distribution and the upper limit Vthe of "1" data threshold voltage distribution. In consideration of the read margin, it is the most desirable that read voltage Vr is set at about (Vthw2+Vthe)/2, for example, −0.5V to 4V. Especially, set as: Vthe is negative; and Vthw2 positive, and it is possible to set the read voltage Vr as ground potential GND. In this case, it becomes unnecessary for employing Vr generator 11e.

Further, it is desirable to set the read voltage Vr to be higher than the ground potential GND. With this consideration, there is not provided a situation that a negative voltage is applied to transistor diffusions in the word line driver 2a, and there is no need of preparing a negative voltage generation circuit. Further in this case, setting the p-type well, on which n-channel MISFETs in the word line driver 2a are formed, to be ground potential GND, it is possible to form the p-type well without being separated from the p-type substrate by a n-type region. This leads to reduction of the circuit area of the word line driver 2a. In addition, since no negative voltages are applied, no minority carrier injections due to the diffusion layers being forward-biased occur, a latch-up phenomenon may be prevented. If a negative voltage is used for word line driving in case there is such a defect that any one of word lines WL0–WL15 is shorted-circuit to n-type diffusion layers 28 in source/drains in the memory cell array 1, the negative voltage causes to carry a forward direction current between the n-type layers 28 and p-type well 23 so as to disturb data. Utilizing no negative voltages for word line driving, such the data disturbance will be prevented.

The pass voltages Vread1/2 and Vread2/2 applied to unselected word lines WL0, WL1 and WL3–WL15 (and, if necessary, the select gate line SSL) are output from the Vread generator 11c and Vread2 generator 11d, respectively. These are set at voltages higher than the upper limit value Vthw of "0" data threshold distribution as shown in FIG. 12.

In this embodiment, as shown in FIG. 5 and FIG. 6A, the gate length (i.e., channel length) of the select gate transistors S1 and S2 is larger than that of control gates of memory cells M0 t0 M15. Further, as known, there is such a line-narrowing effect that the smaller the line width, the higher the line resistance in these gate material films CoSi, TiSi and the like. Due to this, the gate electrodes (i.e., select gate lines) of the select gate transistors S1 and S2 become lower resistive than those (i.e., word lines) of the memory cells M0–M15, and resulting in that the gate of the select gate S1 is boosted to the pass voltage at a rate higher than those of the memory cells M0–M15. In addition, driving the select gate line GSL with a resistance lower than the word lines WL0–WL15 during the bit line discharge, it is possible to reduce the variation of data read timings of memory cells parallel-connected to bit lines.

A little late after having raised the word lines WL0–WL15 and the select gate line SSL, precharge the bit line BL to VBL by use of an internal power supply node in the sense amplifier circuit 3 (timing t1). It is desirable to set the precharge voltage VBL to be higher than the ground potential GND and equal to or lower than the power supply voltage Vcc. This is enough to secure the reliability of transistors constituting the sense amplifier circuit 3 to Vcc.

It is desirable for improving the sensitivity of the sense amplifier to set VBL to be equal to or higher than the threshold voltage of n-channel MISFETs in case these are used to configure the sense amplifier circuit. For example, the voltage VBL is set at about 1V. With such the voltage setting, it is possible to charge up the source/drains and channels from the select transistor S1 to the memory cells M0–M15 to VBL when the selected cell is in a "1" data state (i.e., erase state).

It is required of the above-described bit line (BL) precharge period to take a time length necessary for sufficiently boosting the unselected word lines to the pass voltages Vread1 and Vread2, for example, 100 nsec to 10 μsec. After having elapsed the bit line precharge period, apply a positive control voltage VGSL to the select gate line GSL on the source line side to turn on the select transistor (timing t2). This control voltage VGSL is selected to be higher than the upper limit Vth of the threshold voltage of the select transistors S1 and S2, and equal to or lower than the pass voltages Vread1 and Vread2. With this voltage application, in case the selected memory cell M2's threshold voltage is lower than the read voltage Vr, the NAND cell unit NU becomes conductive, and the bit line BL is reduced in potential. In case the selected memory cell M2's threshold voltage is higher than the read voltage Vr, i.e., in case of "0" data, the memory cell M2 is off, and the bit line BL is not reduced in potential.

In other words, the bit line BL is discharged in accordance with the data state of the selected memory cell M2. This defines a bit line (BL) discharge period. It is required of this BL discharge period to be so long that the bit line BL is sufficiently reduced in voltage in case the selected memory cell is storing "1" data. For example, the BL discharge time is set to be 100 nsec to 100 μsec.

Following the BL discharge, judge the voltage change of the bit line BL, and read out data into the data latch (timing t3). If the sense amplifier circuit 2 includes a voltage clamp circuit, it becomes possible to read data with a high sensitivity even if the bit line BL has not sufficiently changed in voltage. It should be appreciated that the sense amplifier circuit may be configured as a current-sensing type one.

Following the sensing period, a recovery operation period starts at timing t4 for initializing the select gate lines GSL, SL, word lines WL0–WL15 and bit line BL.

Next, making reference to FIGS. 8A to 8D and FIG. 12, a scheme of setting the above-described pass voltages Vread1/z and Vread2/z will be explained in detail. In these drawings, as described above, a pass voltage, which is output from the Vread generator 11c when a word line WLz is selected, is referred to as Vread1/z. FIG. 8A shows a case that memory cell M15 disposed nearest to the common source line SL; FIG. 8B a case that memory cell M13 is selected; FIG. 8C a case that memory cell M2 is selected; and FIG. 8D a case that memory cell M0 disposed nearest to the bit line BL.

Since a read current is carried from the bit line BL to the common source line in this embodiment, it should be appreciated that the source/drain diffusions of memory cells and select transistors in the NAND cell unit are defined as follows: one located on the bit line BL side is referred to as a "drain"; and the other located on the source line SL side as a "source".

In case the word line WL15 is selected as shown in FIG. 8A, unselected word lines are located most on the drain side (i.e., bit line side) of the selected memory cell M15, while in case the word line WL0 is selected as shown in FIG. 8D, there is not any unselected word lines on the bit line side of the selected memory cell M0. Pass voltage Vread1/15 applied to the unselected memory cells (i.e., unselected word lines) on the bit line side of the selected memory cell M15 as shown in FIG. 8A, pass voltage Vread1/13 applied to the unselected memory cells (i.e., unselected word lines) on the bit line side of the selected memory cell M13 as shown in FIG. 8B, and pass voltage Vread1/2 applied to the unselected memory cells (i.e., unselected word lines) on the bit line side of the selected memory cell M2 as shown in FIG. 8C are set in the relationship of: Vread1/15>Vread1/13>Vread1/2.

Explaining in other words, one feature of this embodiment is defined as follows: as shown in FIG. 12, the more unselected word line(s) located on the bit line side of a selected memory cell (i.e., as "z" becomes larger), the higher the pass voltage applied to the unselected word line(s) located on the bit line side. In general, assuming that the integer "z", which is a position index of word line WLz, takes an arbitrary value "i" or "j" (where, i>j), it should be satisfied with a relationship of: Vread1/i≧Vread1/j.

On the other hand, giving attention to the unselected memory cells (i.e., unselected word lines) located on the source side (i.e., source line SL side) of a selected memory cell, the pass voltage Vread2/z is set as follows. Pass voltage Vread2/13 applied to the unselected memory cells located on the source side of the selected memory cell M13 as shown in FIG. 8B, pass voltage Vread2/2 applied to the unselected memory cells on the source side of the selected memory cell M2 as shown in FIG. 8C, and pass voltage Vread2/0 applied to the unselected memory cells on the source side of the selected memory cell M0 as shown in FIG. 8D are set in the relationship of: Vread2/0>Vread2/2>Vread2/13. Therefore, another feature of this embodiment is defined as follows: as shown in FIG. 12, the more unselected word line(s) located on the source line side of a selected memory cell (i.e., as "z" becomes smaller), the higher the pass voltage applied to the unselected word line(s) located on the source line side. In general, assuming that the integer "z", which is a position index of word line WLz, takes an arbitrary value "i" or "j" (where, i>j), it should be satisfied with a relationship of: Vread2/j≧Vread2/i.

According to this embodiment, the threshold voltage variation of the selected memory cell, which is experienced by the data state of unselected memory cells in a data read mode, will be effectively suppressed. To deal with the problem that the conductance of unselected memory cells connected in series to the selected memory cell is changed in accordance with write/erase states thereof, thereby leading to threshold voltage variation of the selected memory cell, it is effective in general to set the control voltage of unselected memory cells to be higher, thereby causing the conductance of unselected memory cells to be higher. However, the control voltage of unselected memory cells is made too high, a large write stress is applied to the unselected memory cells, and it causes erroneous write (i.e., read disturbance) in the unselected memory cells.

In this embodiment, the pass voltage Vread1 applied to unselected memory cells located on the drain side of the selected memory cell is selected in level in accordance with the position of the selected memory cell. With this pass voltage application, it becomes possible to prevent the unselected memory cells from being erroneously written, and suppress the threshold voltage up of the selected memory cell without decreasing the drain conductance of the selected memory cell in a status that many unselected memory cells connected in series with "0" data are located on the drain side of the selected memory cell. On the other hand, applying such a condition as to keep the threshold voltage up of the selected memory cell constant without regard to the number of unselected memory cells with "0" data located on the drain side of the selected memory cell, it is possible to increase the drain conductance of the selected memory cell in the worst case that the entire unselected memory cells located on the drain side of the selected memory cell have "0" data.

Especially, the scheme for setting the pass voltage Vread1/z (z=1, 2, . . . ,15) applied to the drain side unselected memory cells is effective in such a data write scheme that data write is sequentially done from the memory cell nearest to the source line SL in a selected block after having erased the block at a time. In case of this write scheme, unselected memory cells on the source side of a selected memory cell in a write verify operation for the selected memory cell and those in a normal data read operation for the same selected memory cell after data write have the same data status. In other words, there is not any difference in source series resistances between the two read operations. Therefore, the threshold voltage variation of the selected memory cell, which is appeared due to the source potential variation of it, may be suppressed.

This embodiment has a feature, in addition to the setting method of the pass voltage Vread1 applied to unselected memory cell(s) on the drain side of the selected memory cell, or as independent from it, that pass voltage Vread2/z (z=0, 1, ... ,14) is set in accordance with the number of unselected memory cell(s) on the source side of the selected memory cell. That is, according to this embodiment, it becomes possible to prevent the unselected memory cells from being erroneously written, and suppress the threshold voltage up of the selected memory cell without increasing the source series resistance of the selected memory cell in a status that many unselected memory cells connected in series with "0" data are located on the source side of the selected memory cell. Further, using such a condition as to keep the threshold voltage up of the selected memory cell constant without regard to the number of unselected memory cells with "0" data located on the source side of the selected memory cell, it is possible to decrease the source series resistance of the selected memory cell in the worst case that the entire unselected memory cells located on the source side of the selected memory cell have "0" data, and prevent the unselected memory cells from being erroneously written.

Especially, the scheme for setting the pass voltage Vread2/z applied to the source side unselected memory cells is effective also in such a data write scheme that data write is done at a random access in a selected block after having erased the block at a time. In case of this write scheme, unselected memory cells on the source side of a selected memory cell in a write verify operation for the selected memory cell and those in a normal data read operation for the same selected memory cell after data write have different data statuses from each other, i.e., source series resistances are different from each other between the two read operations. However, applying such a condition that as the unselected memory cell(s) are located more on the source side of the selected memory cell, the pass voltage Vread2 is set to be higher, it becomes possible to substantially suppress the variation of the source series resistance of the selected memory cell, whereby the threshold voltage variation of the selected memory cell, which is appeared due to the source potential variation of it, may be suppressed.

As described above, pass voltages applied to the unselected memory cells, which are located on the source side and the drain side of a selected memory cell, are set at most suitable values in accordance with the position of the selected memory cell, respectively. For this purpose, the internal voltage generating circuit 11 has, as described above, two pass voltage generators, Vread generator 11c and Vread2 generator 11d, and select page address is input to them for serving as a control input for controlling the output voltages thereof.

Figure 9:
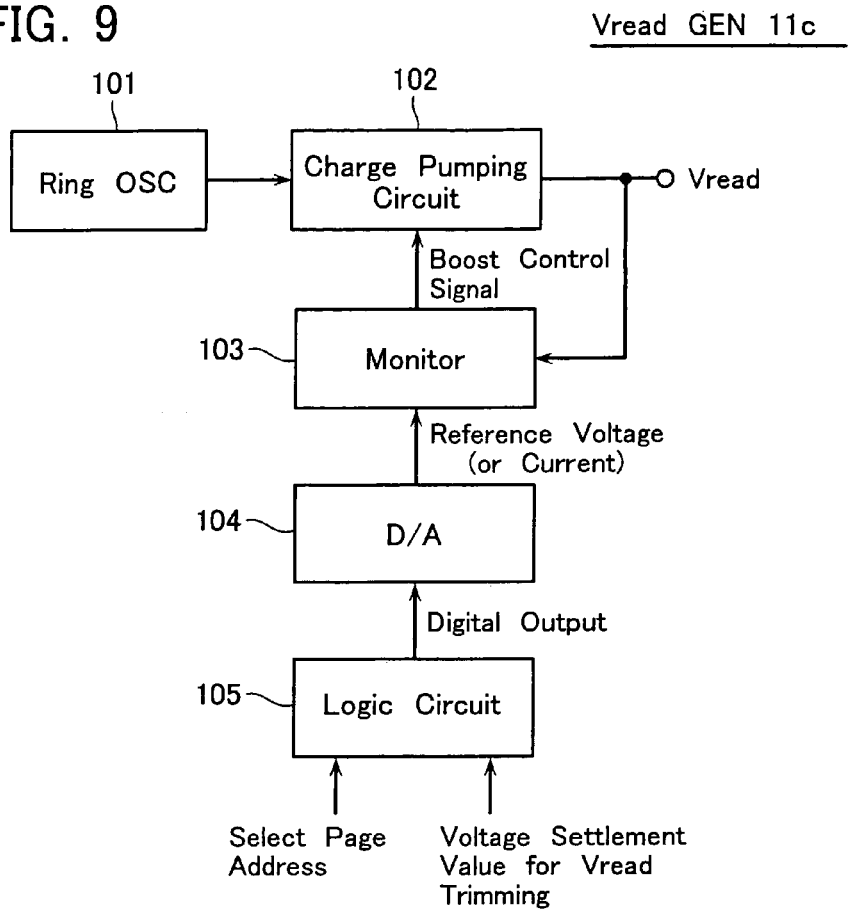
FIG. 9 is a diagram showing a read pass voltage generator of the flash memory.

A detailed configuration example of Vread1 generator 11c, the output of which is exchangeable in level, is shown in FIG. 9. Note here that Vread2 generator 11d may be configured as well as Vread generator 11c. A ring oscillator 101 and a charge pumping circuit 102 driven by oscillation outputs thereof constitute a boost circuit, which outputs a pass voltage Vread, i.e., a high voltage boosted to be higher than the power supply voltage. Disposed at the output node of this boost circuit is a voltage (or current) monitor circuit 103 which serves for limiting the boost operation. This monitor circuit 103 is configured to control the charge pumping circuit 101 so as to stop or decrease the drivability thereof. With this monitor circuit 103, a negative feedback circuit is constructed with respect to the boost operation, thereby being possible to generate a static output voltage.

The ring oscillator 101, charge pumping circuit 102 and monitor circuit 103 are formed of well-known circuits (for example, refer to Published and Unexamined Japanese Patent Application No. 2000-106998). Further, to generate a boosted voltage, the level of which is exchanged in response to a reference signal (voltage or current), it may be utilized a scheme that a plurality of charge pumping circuits are disposed to be exchangeable (for example, refer to Published and Unexamined Japanese Patent Application No. 7-111095).

The monitor circuit 103 is formed of, for example, a comparator for comparing the pass voltage Vread with a reference voltage. Alternatively, the monitor circuit 103 may include a voltage-divide circuit (or current-divide circuit) formed of resistors for dividing the pass voltage Vread, and compare the divided voltage (or current) with a reference voltage (or current). By use of such configuration, the monitor circuit 103, which is to feedback the pass voltage Vread (for example, equal to or higher than 3V), may be formed as an active device circuit, which is operable in a voltage rage lower than Vread. Therefore, it becomes possible to employ active devices each having a small area and a low breakdown voltage in the monitor circuit 103, whereby the occupied area of the monitor circuit 103 may be reduced more.

In case of using a reference current, the monitor circuit 103 is configured to compare a divided current, which is for example obtained by resistance-dividing the Vread output, with a reference current. A reference voltage (or current) generating circuit is constituted by a logic circuit 105, to which digital data is input, and a D/A converter 104, which converts the output of the logic circuit 105 to an analog value. The analog value output from D/A converter 105 serves as the reference voltage (or current).

The logic circuit 105 receives two digital signals, i.e., a page address signal selected at a data read time and a voltage settlement value for Vread trimming, logical value of which is adjustable after having formed all wiring layers, and then generates and outputs a sum logic signal thereof. The voltage settlement value serves as a data for adjusting the boosted voltage to a suitable value. This value is written and stored in a non-volatile memory circuit with fuses, anti-fuses and the like based on a wafer test resultant, and automatically read out at a power-on time of the memory device to be used for voltage adjusting. To keep the adjusted pass voltage Vread in a certain range, it is desirable to hold the adjusted value even if the power is off after having set the pass voltage for a page at a shipment test time.

Figure 10:
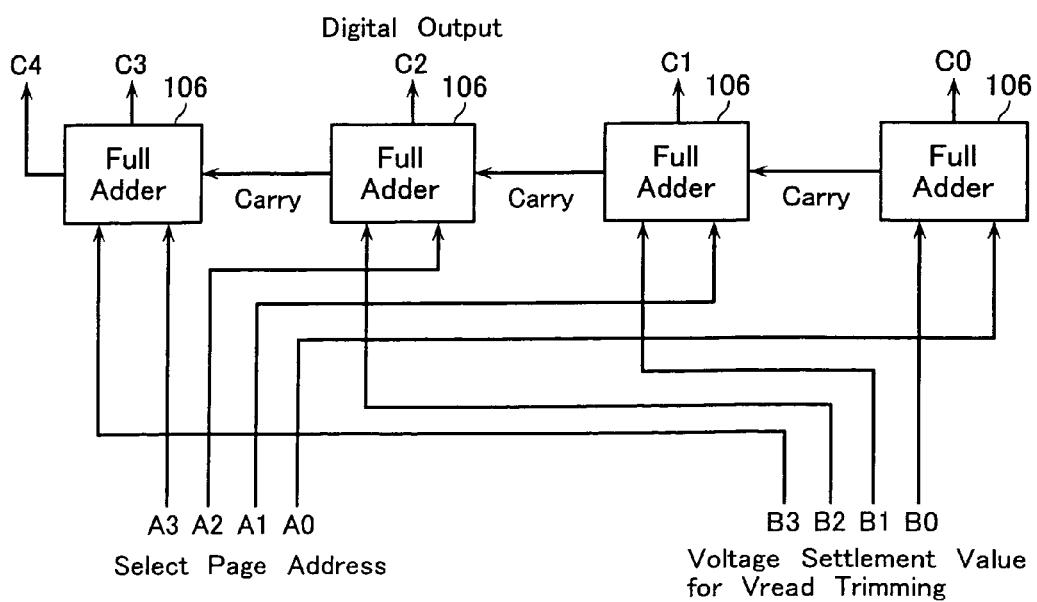
FIG. 10 is a diagram showing a logic circuit used in the generator shown in FIG. 9.

FIG. 10 shows a configuration example of the logic circuit 105, in which full adders 201 are connected in series to constitute a Manchester-type adder circuit. In FIG. 10, A3–A0 are signal lines to which a select page address signal (digital signal) is supplied, B3–B0 are signal lines to which a trimming settlement signal (digital signal) is supplied. Inputting the selected page address signal and trimming settlement signal into the Manchester-type adder circuit, the sum of the selected page address signal and trimming settlement signal is output to C4–C0 as a digital data.

Since the logic circuit 105 is configured to output a digital signal, it is hardly experienced with noises and possible to secure a wide dynamic range in comparison with such a scheme as to generate an analog signal from the selected page address signal and another analog signal from the trimming settlement signal, and then adding these analog signals. Further, since there is provided only one D/A converter 104, it is possible to easily secure monotonicity for the sum of the selected page address and trimming settlement value. As a result, even if the voltage settlement value is set to have a small step, the pass voltage may be precisely set.

In the logic circuit 105, assign only upper address bits of the selected page address to A1 and A0, and set A3 and A2 to be GND, and the word lines are classified into four groups of: WL0–WL3, WL4–WL7, WL8–WL11 and WL12–WL15. With this grouping, it becomes possible to generate pass voltages in such a manner that pass voltages are different from each other for the respective groups, while each pass voltage is used common to the word lines in each group.

As described above, it is easy to change a voltage step defined due to difference of the selected page address and/or another voltage step due to the trimming data and assign them to the pass voltage. Further, divide the digital value of the selected page address with a division circuit, and it becomes possible to assign a certain integer times trimming data step to the voltage step defined due to difference of the selected page address.

According to this embodiment, based on the setting scheme of the pass voltages Vread1/z and Vread2/z, it is also possible to effectively suppress the threshold voltage variation of a selected memory cell due to the write/erase states of unselected memory cells connected in series to a selected memory cell (i.e., so-called "back pattern"). This effect will be explained in detail bellow.

We have already reported an analysis model with respect to the threshold voltage variation of a selected memory cell due to the back pattern (refer to Published and Unexamined Japanese Patent Application No. 2002-358792). Supposing that the maximum threshold variation of a selected memory cell is referred to as $\Delta Vth$, and threshold current defining the threshold voltage is referred to as Ith, Ith/$\Delta Vth$ is expressed by a substantially linear function of (Vread1–Vthw) as shown in FIG. 11, where Vread1 is a pass voltage applied to unselected memory cells located on the drain side of the selected memory cell.

Figure 11:
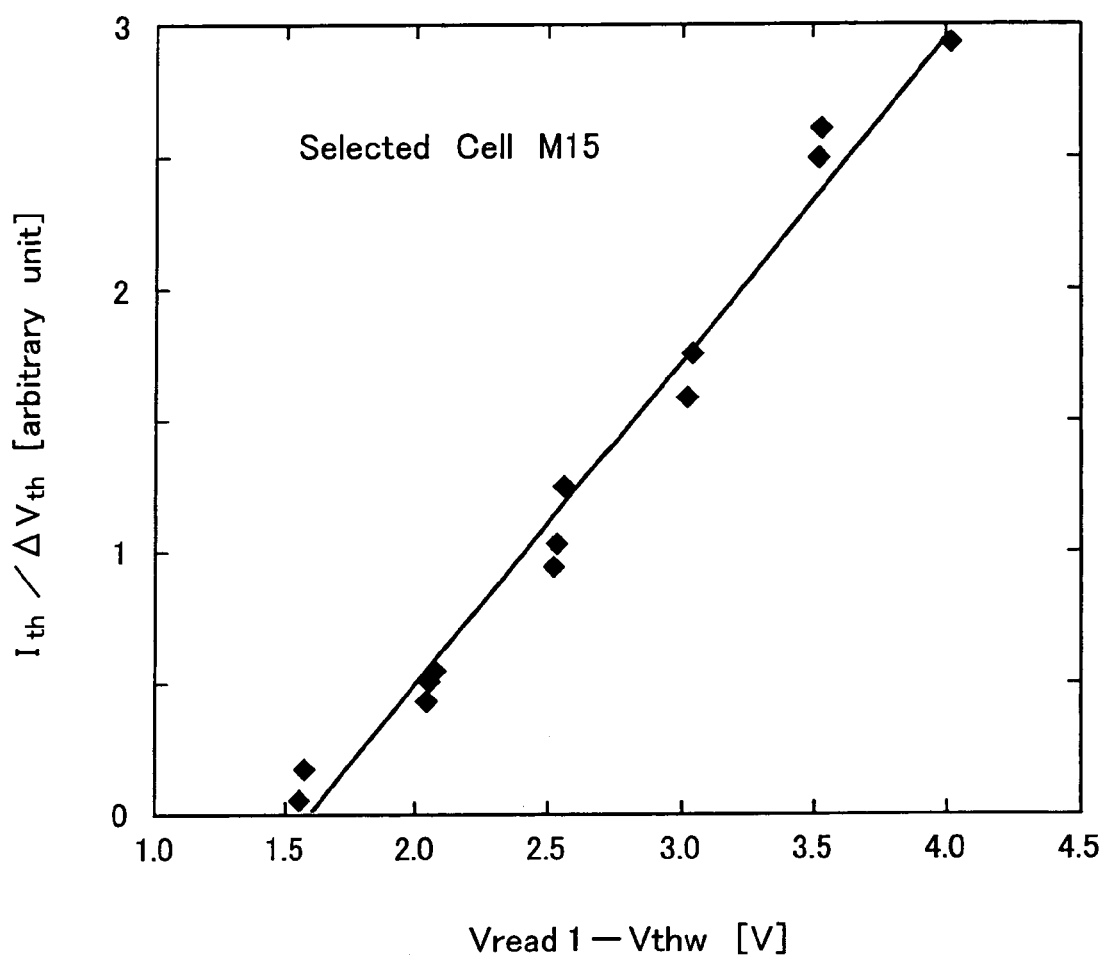
FIG. 11 shows data of threshold voltage up of a memory cell due to back patterns.

FIG. 11 shows Ith/$\Delta Vth$ in case the selected memory cell is M15 nearest the common source line, and pass voltage Vread1 and write threshold voltage Vthw of the memory cells M0–M15 are variously changed. Erase threshold voltage Vthe is fixed at –2V, and Ith is selected in a range of 10 pA to 2 $\mu$A. Pass voltage Vread1 is selected in a range of 3V to 6V, while pass voltage Vread2 is fixed at a certain value selected in a range of 3V to 6V. Write threshold voltage Vthw is selected in a range of 0V to 4V.

The characteristic shown in FIG. 11 will be explained as follows. In case the drain conductance of the selected cell is sufficiently lower than those of unselected cells and select transistors, and the selected cell operates in the current saturation region (i.e., pentode operation region), the voltage between the bit line and common source line is almost applied between the drain and source of the selected cell. As a result, the source potential of the selected memory cell is greatly lowered from the drain potential. Supposing that the unselected cells located on the drain side of the selected cell operates in the linear operation region, each conductance of them becomes the lowest when the corresponding cell is in a write state of Vthw, and it is expressed as: $\beta cell \times (Vread1/z-Vthw-V0)$, where V0 is a constant value. The total conductance of the unselected cells on the bit line side of the selected cell becomes smaller as the number of the unselected cells on the bit line side, nk, becomes larger. Ignoring the substrate bias effect, the total conductance will be substantially expressed as: $\beta cell \times (Vread1/z-Vthw-V0)/nk$.

Since the unselected cells have a threshold voltage Vthe in an erase state, the drain voltage variation $\Delta VD$ of the selected cell, that is changed due to the conductance change based on the write/erase state of the unselected cells located on the bit line side and connected in series to the selected cell, is approximately expressed by the following expression (1).

$$\Delta Vth \propto \Delta VD = (Ith \cdot nk/\beta cell)[1/(Vread1/z-Vthw-V0)-1/(Vread1/z-Vthe-V0)] \quad (1)$$

Assuming, for example, Vthw=1V and Vthe=–2V in the expression (1), the second term in the brackets can be ignored because it is smaller than the first term. Therefore, the expression (1) will be approximately revised to the following expression (2).

$$\Delta VD \sim Ith \cdot nk/[\beta cell \cdot (Vread1/z-Vthw-V0)] \quad (2)$$

As above-described, it can be obtained an approximation that the threshold variation $\Delta Vth$ is proportional in reverse to (Vread1/z–Vthw–V0). The source potential of the selected memory cell is not changed in case the constant current Ith is carried. Since the threshold lowering $\Delta Vth$ of the selected memory cell due to "drain-induced barrier lowering" effect is proportional to $\Delta VD$, the experimental characteristic shown in FIG. 11 can be reasonably explained.

In a case where the number "nk" of unselected cells located on the bit line side is small in FIGS. 8A to 8D, $\Delta Vth$ becomes small as apparent from the expression (2). Therefore, keeping (Vread1/z–Vthw–V0)/nk constant, it becomes possible to let $\Delta Vth$ be approximately constant.

FIG. 12 shows such an example of the pass voltage setting. As shown in FIG. 12, the pass voltages are selected with a relationship of: Vread1/15>Vread1/14>Vread1/13> . . . >Vread1/1, where each voltage step is approximately constant, such that $\Delta Vth$ becomes constant based on the expression (2). In this example, in case of "z" being 1 or more, Vread1/z is set to be equal to or higher than Vthw+VBL.

Further, if a gate voltage is applied to the entire unselected memory cells, as the number of unselected memory cells located on the source side of a selected memory cell increases more, the sum of these channel resistances becomes larger. By contrast, according to this embodiment where the pass voltage Vread2 is boosted higher as the unselected memory cells are located more on the source side of the selected memory cell, it becomes possible to suppress the resistance increasing due to the unselected memory cells located on the source side. Especially, the channel conductance variation of an unselected memory cell in case it is changed from an erase state ("1") to a write state ("0") is proportional to [1/(Vread2/z–Vthw–V0)–1/(Vread2/z–Vthe–V0)] as well as the examination result for the pass voltage Vread1/z on the drain side. Therefore, boosting higher the pass voltage Vread2/z as the unselected memory cells are located more on the source line side, it is possible to suppress the resistance increase due to the threshold voltage change of the unselected memory cells located on the source line side. Especially, since the resistance increase of the unselected memory cells located on the source side of the selected memory cell leads to threshold voltage up of the unselected memory cells due to a so-called substrate bias effect, the threshold voltage change becomes larger than that in a case where the resistance of the unselected memory cells located on the drain side of the selected memory cell increases by the same value. In consideration with this, it is desirable to effectively suppress the threshold voltage variation that the uppermost voltage Vread2/0 in the pass voltages Vread2 is, as shown in FIG. 12, set to be higher that the uppermost voltage Vread1/15 in the pass voltages Vread1.

In case the entire memory cells M0–M15 are subjected to a certain number of data read operations in this embodiment, it is possible to decrease the total Vread stress of the entire unselected memory cells with maintaining the minimum read current in comparison with a conventional case where all data read operations are performed with a constant pass voltage equal to Vread2/0. That is, supposing that a storing charge amount up of the charge storing layer due to data disturbance when a pass voltage Vread is applied is $\Delta Q$, the maximum value of the total Vread stress in a case that the entire memory cells M0–M15 are subjected to a certain number of data read operations is proportional to Max[$\Sigma \Delta Q$ (Vread1/z),(Vread2/z)].

It is noted that when an evaluation target memory cell position is z=m, "$\Sigma$" means to sum up the stress in a range of k=0~15, where "k" is a memory cell position sequentially selected in the NAND cell unit. In this case, select Vread2/z when k>m; select Vread1/z when k<m; and don't sum when k=m. As described above, selecting Vread1/z, Vread2/z in accordance with the selected cell's position for securing the minimum read current necessary for reading, it appears to reduce the total amount of the read stress.

Figure 13:
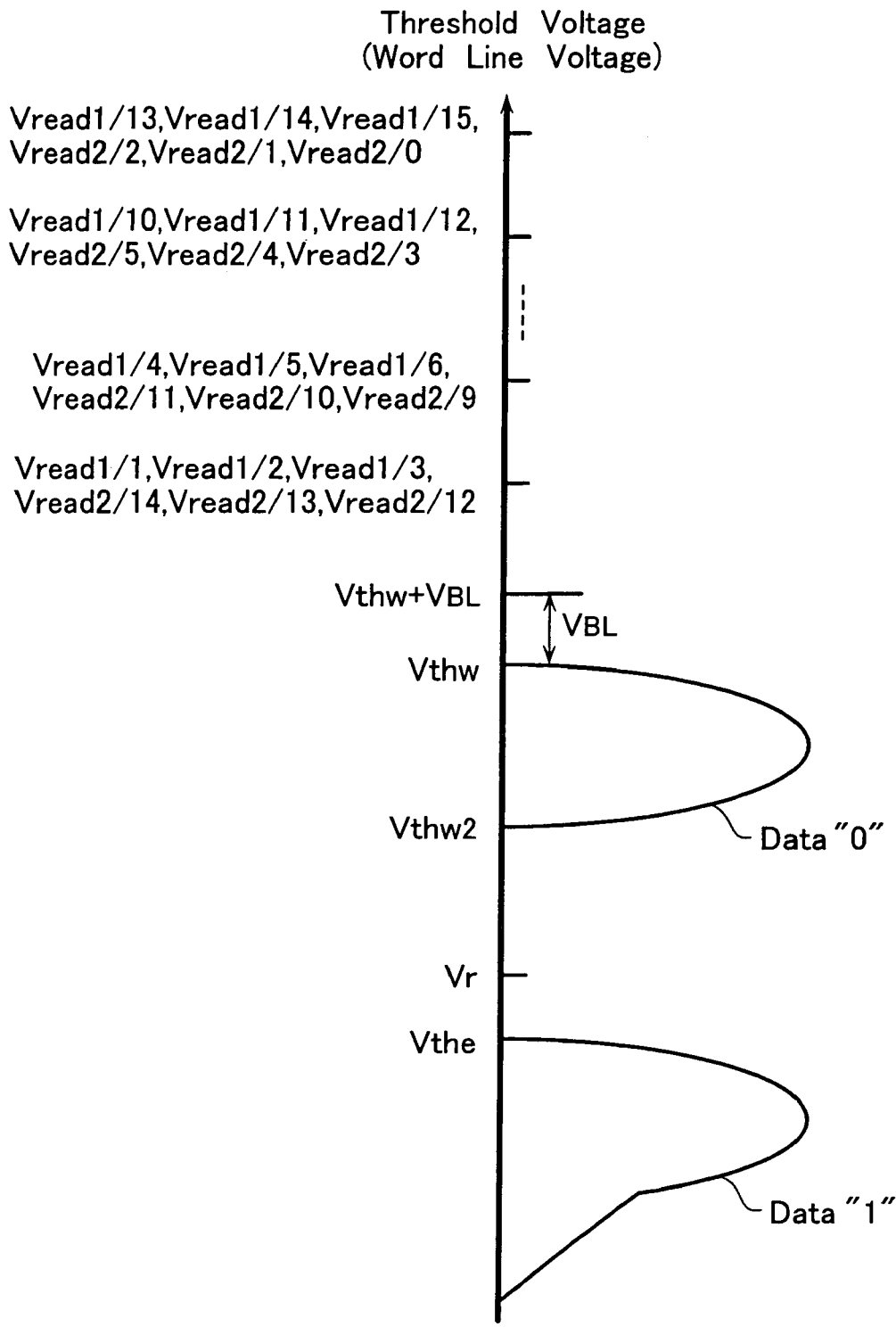
FIG. 13 shows another example of pass voltages set in a data read operation in accordance with this embodiment.

FIG. 13 shows another example of the pass voltage setting. In this example, the selected memory cell positions "z" are classified into three groups in the range of z=0 to 15, and an identical pass voltage is used in each group such as: Vread1/15=Vread1/14=Vread1/13, Vread1/12=Vread1/11=Vread1/10, ..., Vread1/3=Vread1/2=Vread1/1, and Vread2/14=Vread2/13=Vread2/12, Vread2/11=Vread2/10=Vread2/9, ..., Vread2/2=Vread2/1=Vread2/0.

As described above, the pass voltages Vread1/z and Vread2/z may be grouped. In general, supposing that an arbitrary value "i" or "j" is taken in a range of 1 to 15 which corresponds to a selected cell position "z", it is satisfied with the relationships of: Vread1/i$\geq$Vread1/j and Vread2/j$\geq$Vread2/i in case of i>j. With this pass voltage application, it is possible to suppress the erase threshold voltage up due to read disturbance in comparison with the conventional case. Further, applying such the grouped pass voltages as described above, it becomes possible to decrease the signal bits necessary for the logic circuit 105 including a logical adder circuit and D/A converter 104, thereby reducing these circuit areas.

In this embodiment, setting the pass voltage under a condition that the threshold voltage up due to read disturbance is the same as the conventional case, i.e., max[$\Sigma \Delta Q$ (Vread1/z),(Vread2/z)] is the same as the conventional case, and satisfying the relationships of Vread1/i$\geq$Vread1/j and Vread2/j$\geq$Vread2/i in case of i>j (where "i" and "j" are arbitrary values taken in a range of 1 to 15 which corresponds to a selected cell position "z"), the total drain conductance of unselected memory cells in case the memory cell M15 is selected may be higher than that in the conventional case. Therefore, the difference between the maximum and minimum values of the read current (i.e., read current variation) may be made less. As a result, the difference between the maximum and minimum read times determined by the read current may be made less, and this makes possible to make a read timing constant and judge data at a high rate. In addition, this makes possible to reduce a generation probability of erroneous read operations due to electromagnetic noises, thereby improving the reliability of the memory device.

Further, since the erroneous write stress at a data read time with respect to unselected memory cells connected in series to a selected memory cell may be reduced, the threshold voltage gap, which separates "0" data from "1" data, may be lessened. Therefore, such a data disturbance due to that data threshold voltage distributions are overlapped may be reduced. Based on a fact that the threshold voltage separating gap becomes lessened, it is possible to lower the "0" data threshold voltage. This leads to reduce the write time, write voltage and the upper limit of the pass voltage Vread, and reduce the circuit areas of the write voltage generator, Vread generator and the like.

Effects of this embodiment will be summarized as follows:

(a) With changing the pass voltage Vread2 applied to unselected memory cells located on the source side of a selected memory cell in accordance with the selected memory cell's position in a NAND cell unit, it is possible to lessen the variation of the selected memory cell' source series resistance due to the unselected memory cells' data and positions, thereby suppressing the variation of read current. In addition, exchanging the pass voltage Vread1 applied to unselected memory cells located on the drain side of the selected memory cell in accordance with the selected memory cell's position in the NAND cell unit as well as the pass voltage Vread2, the variation of the read current will be more effectively suppressed. As a result, it is able to make the read timings even, and judge data at a high rate.

(b) With keeping the maximum of the read time constant, it is possible to reduce the maximum of electromagnetic noises generated based on the read current. In detail, with a small read current, the data read may be done free from the potential variations due to capacitive coupling between adjacent data transfer lines. That is, the provability of erroneous data read due to electromagnetic noises may be reduced, and a high reliability will be obtained.

(c) Since the maximum read current is lessened, it is possible to suppress threshold voltage variations and increased leakage currents of transistors due to heat increasing. Additionally, voltage variations of the common source line may be suppressed. And this leads to reduce the wiring areas for short-circuiting the common source line, thereby improving the occupy rate of the memory cell array area in the chip.

(d) It may be suppressed that the upper limit of "1" data threshold voltage (i.e., erase threshold voltage) is shifted in the positive direction. Therefore, even if the voltage separating range between "1" and "0" data threshold voltage distributions is the same as that in the conventional case, it is possible to secure a large data margin. Further, even when threshold voltage shift is generated somewhat due to deterioration of the charge storing characteristic, temperature change and the like, such a data disturbance due to that different data threshold voltage distributions are overlapped may be reduced.

(e) Since the shift amount of the erase threshold voltage is suppressed, it becomes possible to make the voltage separating range between "1" and "0" data threshold voltage distributions small. As a result, it becomes possible to lower the write threshold voltage, i.e., to set the upper limit of the write threshold voltage distribution to be low, thereby shortening a time necessary for performing data write.

(f) Even if reducing the write electric field, data write may be performed at a high rate. Therefore, it is possible to suppress the deterioration of reliability of the tunnel insulation film, ONO film and the like due to repeating the write cycle. Further, since the self electric field due to the stored charge becomes small, the charge storing characteristic of each memory cell will be kept good. In addition, it becomes possible to lower the pass voltage applied to unselected memory cells. It becomes also possible to improve a problem that repeated read operations cause to inject negative charges into the charge storing layer, thereby causing threshold voltage up. As a result, it is possible to statically secure the voltage separating width between erase and write threshold voltage distributions.

(g) It is possible to secure large voltage separating gap between "1", "0" data threshold voltage distributions and the judging threshold voltage at a read time. In other words, a data judging margin may be secured large. Therefore, it becomes possible to reduce the frequency of erroneous reads. And this leads to increase the read current in case a selected cell's threshold voltage is lower than the judging threshold voltage, with keeping the read current constant in case a selected cell's threshold is higher than the judging threshold voltage, thereby improving the data read speed to be high.

Embodiment 2

Next, another embodiment 2 will be explained, in which the read current is carried from the common source line SL to the bit line BL in contrast to the above-described embodiment 1. The EEPROM configuration shown in FIG. 1 to FIG. 6C and the Vread generator shown in FIGS. 9 and 10 are used as there are in this embodiment 2.

Figure 14:
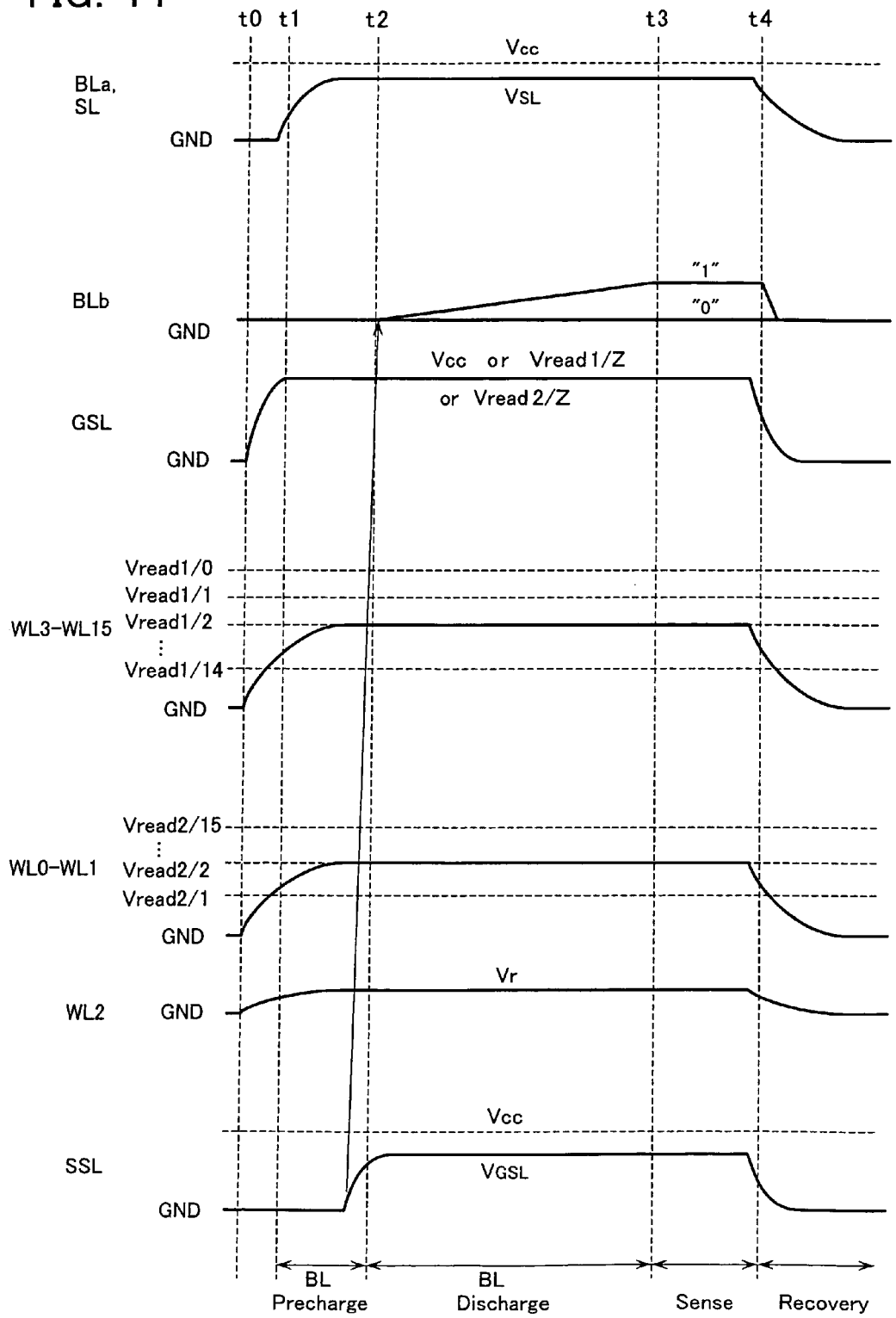
FIG. 14 shows a timing chart of a data read operation in accordance with another embodiment.

FIG. 14 shows a data read timing chart in this embodiment 2, which corresponds to that shown in FIG. 7 in the embodiment 1. An example of the pass voltage Vread set in this embodiment is shown in FIGS. 15A to 15D, and FIGS. 16 and 17 which correspond to FIGS. 8A to 8D, and FIGS. 12 and 13, respectively, in the above-described embodiment.

In this embodiment, a memory cell coupled to one bit line BLxb within the bit lines BLxa and BLxb shown in FIGS. 2 and 3 is subjected to data read by the sense amplifier, and the other, unselected bit line BLxa is fixed in potential at substantially the same level as the source line SL so as to serve as a shield line for preventing potential variation (hereinafter, "x" will be omitted sometimes). Although FIGS. 2 and 3 show an example where two bit lines BLa and BLb are selectively coupled to a sense amplifier, it may be allowable that four or more bit lines are selectively coupled to a sense amplifier. In this case also, utilizing at least one bit line in unselected bit lines as a shield line, shield effect can be obtained.

With respect to the above-described shield effect, the configuration shown in FIG. 2, in which at least one shield bit line BLa locates in each space of the plural bit lines BLb connected to read cells, is desirable for reducing capacitive coupling noises between bit lines due to read currents. According to this embodiment, read disturbance may be suppressed also in the memory cells connected to the shield bit lines.

Figure 15A:
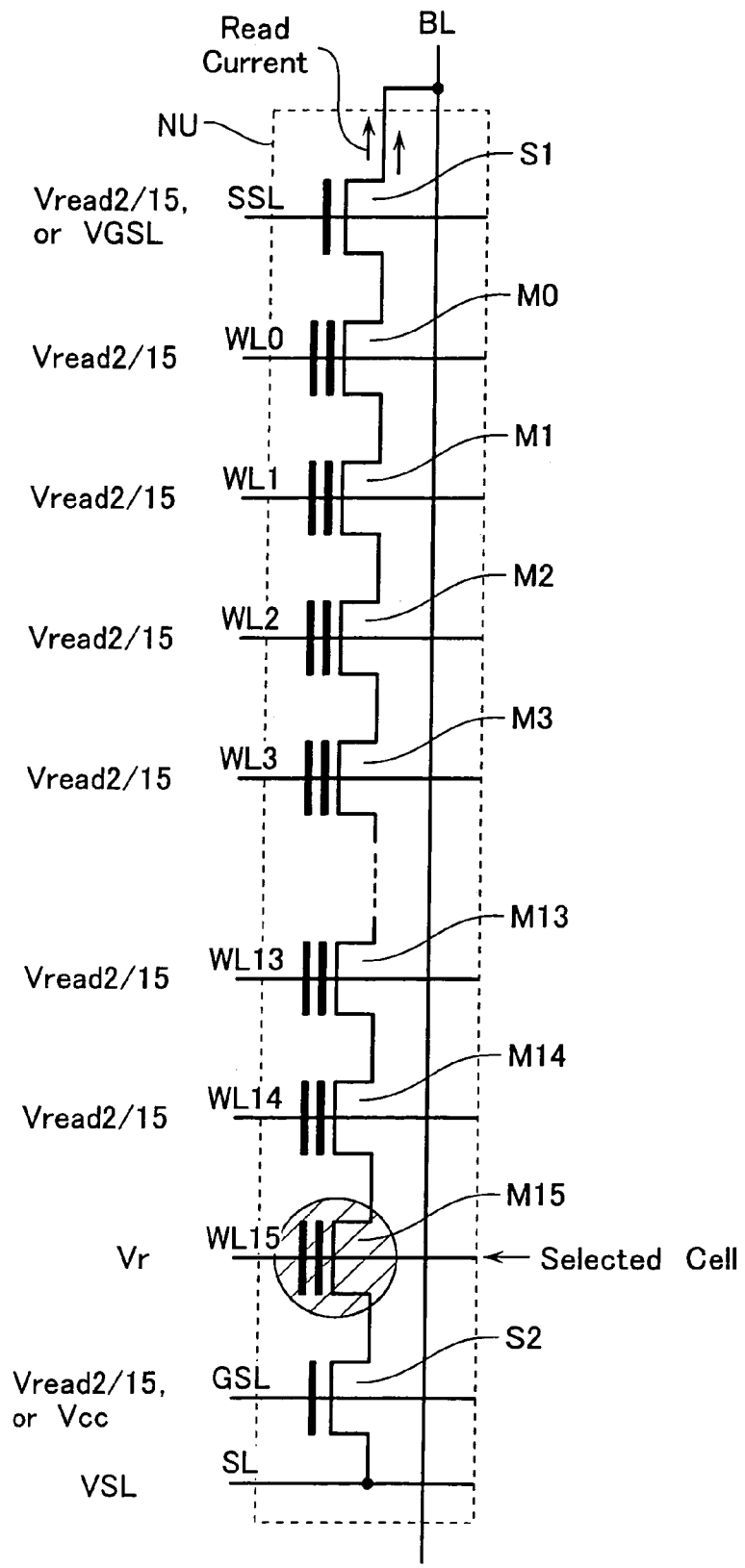
FIGS. 15A to 15D show relationships of voltage application states of the NAND cell unit in case memory cells M15, M13, M2 and M0 are selected, respectively, at a data read time.
Figure 15B:
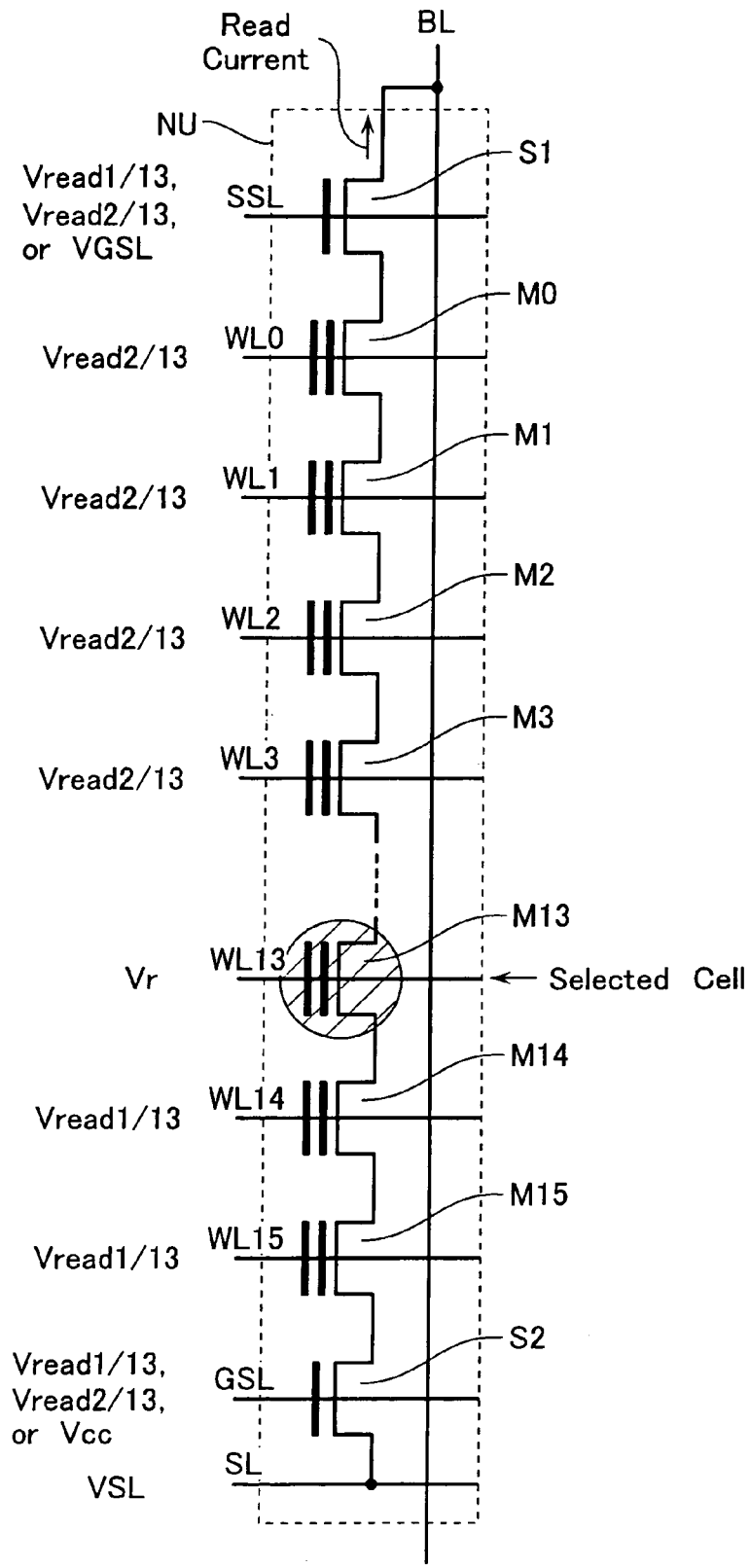
Figure 15C:
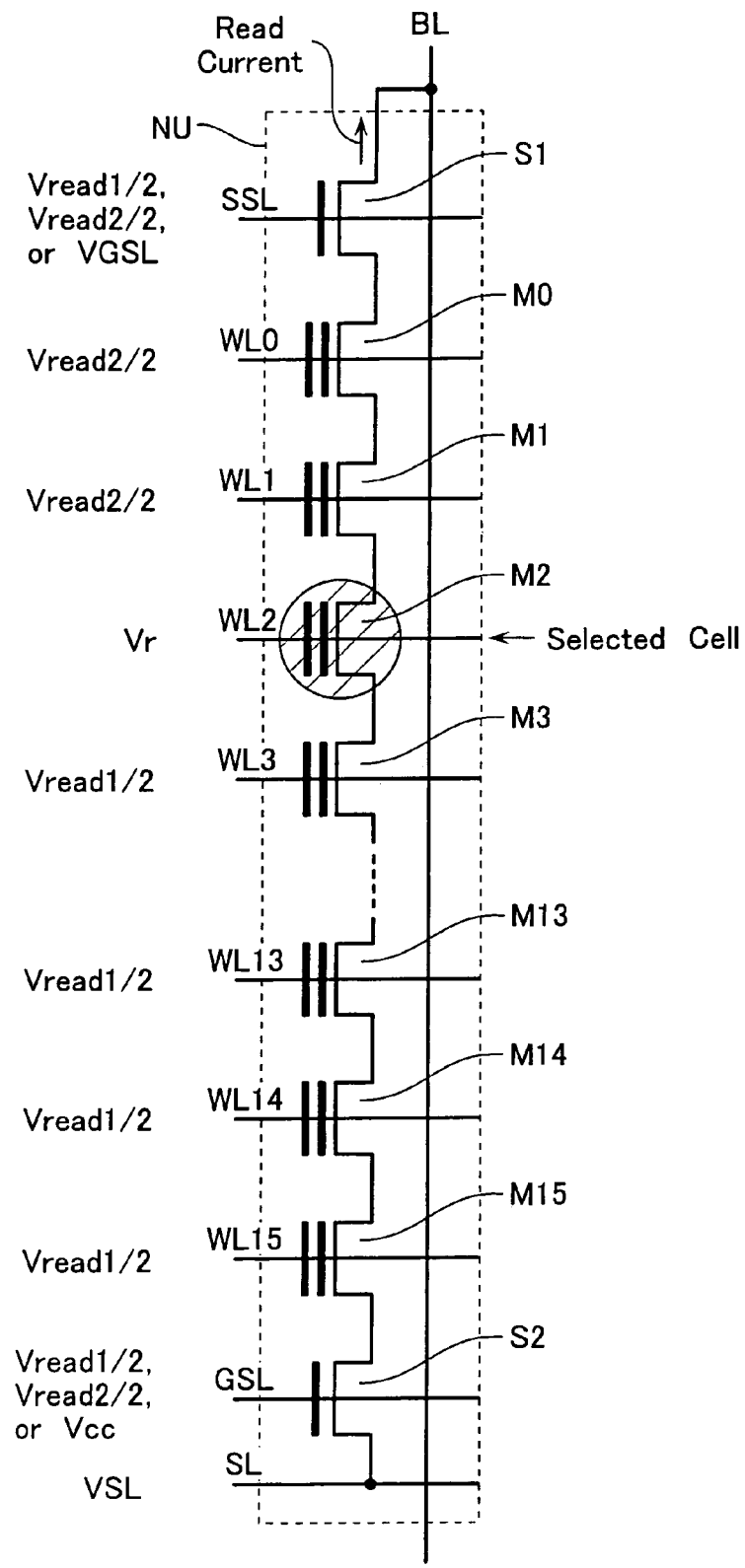
Figure 15D:
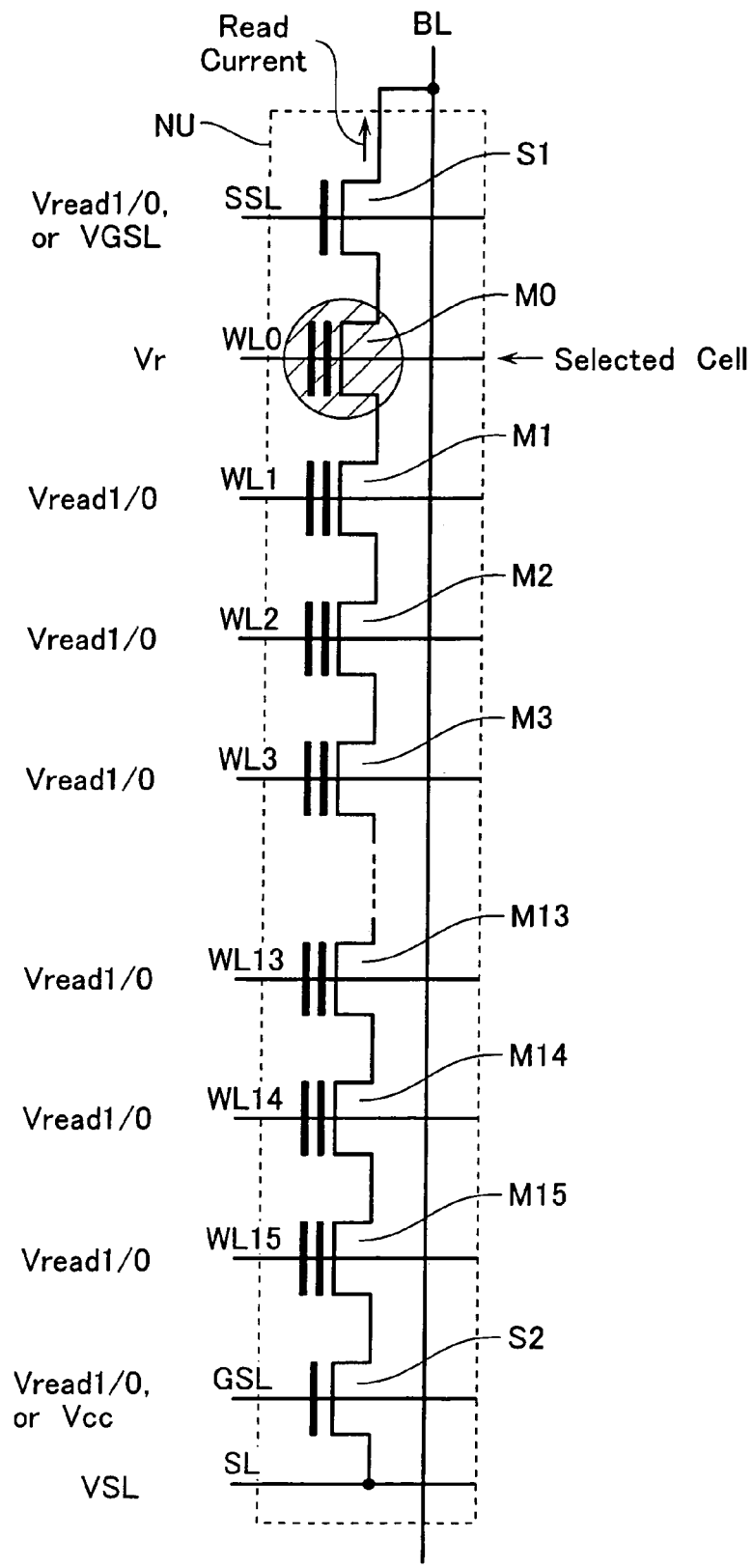

FIG. 14 shows a case where a memory cell, which is connected to bit line BLb, and driven by a word line WL2 selected in the word lines WLz (z=0, 1, . . . ,15), is subject to a data read operation. The voltage relationship in the NAND cell unit in this case is shown in FIG. 15C. FIG. 15A shows a case where memory cell M15 nearest to the common source line SL is selected; FIG. 15B a case where memory cell M13 is selected; and FIG. 15D a case where memory cell M0 nearest to the bit line BL is selected. In other cases where other memory cells are selected, the pass voltages applied to unselected memory cells located on the source and drain sides of the selected memory cell may be set as similar to the above-described example.

Note here that source/drain diffusion layers of memory cells and select transistors in the NAND cell unit are reversed to those in the above-described embodiment 1 because the read current is carried from the common source line SL to the bit line BL in this embodiment 2. That is, in each cell and in each transistor, one diffusion layer located on the common source line SL side serves as a "drain"; and the other diffusion layer located on the bit line BL side as a "source". As shown in FIGS. 15A to 15D, Vread1/z is applied to unselected word lines located on the drain side of the selected memory cell (i.e., common source line SL side); and Vread2/z to unselected word lines located on the source side of the selected memory cell (i.e., bit line BL side).

As well as the above-described embodiment 1, at the data read time, a word line driver 2a is activated in correspondence with a selected block selected by the block decoder 2b, and as shown in FIG. 14, Vcc (or pass voltage Vread1/2 or Vread2/2) is applied to the select gate line GSL disposed on the common source line SL side; a read voltage Vr to a selected word line WL2; a pass voltage Vread1/2 to unselected word lines WL3–WL15; and a pass voltage Vread2/2 to unselected word lines WL0 and WL1 on the source line side, respectively, at timing to.

At timing t1, the same voltage VSL is applied to the common source line SL and unselected bit line BLa, and then voltage VGSL, which is able to turn on the select transistor, is applied to the select gate line SSL located on the bit line side at timing t2. With these voltage applications, the bit line BLb, which has been precharged to 0V, will be charged up by the read current carried from the common source line SL (in case of data "1"), or not charged (in case of data "0").

After bit line charging for a certain period, data sense is performed at timing t3. In case the selected bit line is charged up to be equal to or higher than a certain level, it will be judged as a data "1"; and in case the selected bit line is lower than the certain level, it will be judged as a data "0". From timing t4, a recovering operation is performed for discharging the bit lines, word lines and common source line.

During the data read operation, select gate lines SSL, GSL and word lines WL0–WL15 in unselected blocks are kept in a floating state or 0V, thereby preventing the memory cells in these blocks from being erroneously read and disturbed.

The read voltage Vr is set between the lower limit Vthw2 of "0" data threshold voltage distribution and the upper limit Vthe of "1" data threshold voltage distribution. In consideration of the read margin, it is the most desirable that read voltage Vr is set at about (Vthw2+Vthe)/2, for example, −0.5V to 4V. Especially, setting as: Vthe is negative; and Vthw2 positive, it is possible to set the read voltage Vr as ground potential GND. In this case, it becomes unnecessary for employing Vr generator 11e.

Further, it is desirable to set the read voltage Vr to be higher than the ground potential GND. With this consideration, there is not provided a situation that a negative voltage is applied to transistor diffusions in the word line driver 2a, and there is no need of preparing a negative voltage generation circuit. Further in this case, setting the p-type well, on which n-channel MISFETs in the word line driver 2a are formed, to be ground potential GND, it is possible to form the p-type well without being separated from the p-type substrate by a n-type region. This leads to reduction of the circuit area of the word line driver 2a. In addition, since no negative voltages are applied, no minority carrier injections due to the diffusion layers being forward-biased occur, a latch-up phenomenon may be prevented.

Further, in this embodiment, as shown in FIG. 14, the shield bit line BLa is applied with a voltage VSL at the data read time, which is the same as that applied to the common source line SL. Therefore, the maximum of erroneous write voltage stress applied to memory cells connected to the unselected shield bit line BLa is defined by higher one of Vread1/z-VSL and Vread2/z-VSL, and this is less than Vread-GND that is applied to memory cells connected to a shield bit line in a conventional case. In addition, as the common source line SL and unselected shield bit line BLa are held at the same potential at the read time, the unselected bit line BLa serves as a shield line, thereby reducing capacitive coupling noises between bit lines BLb.

Figure 16:
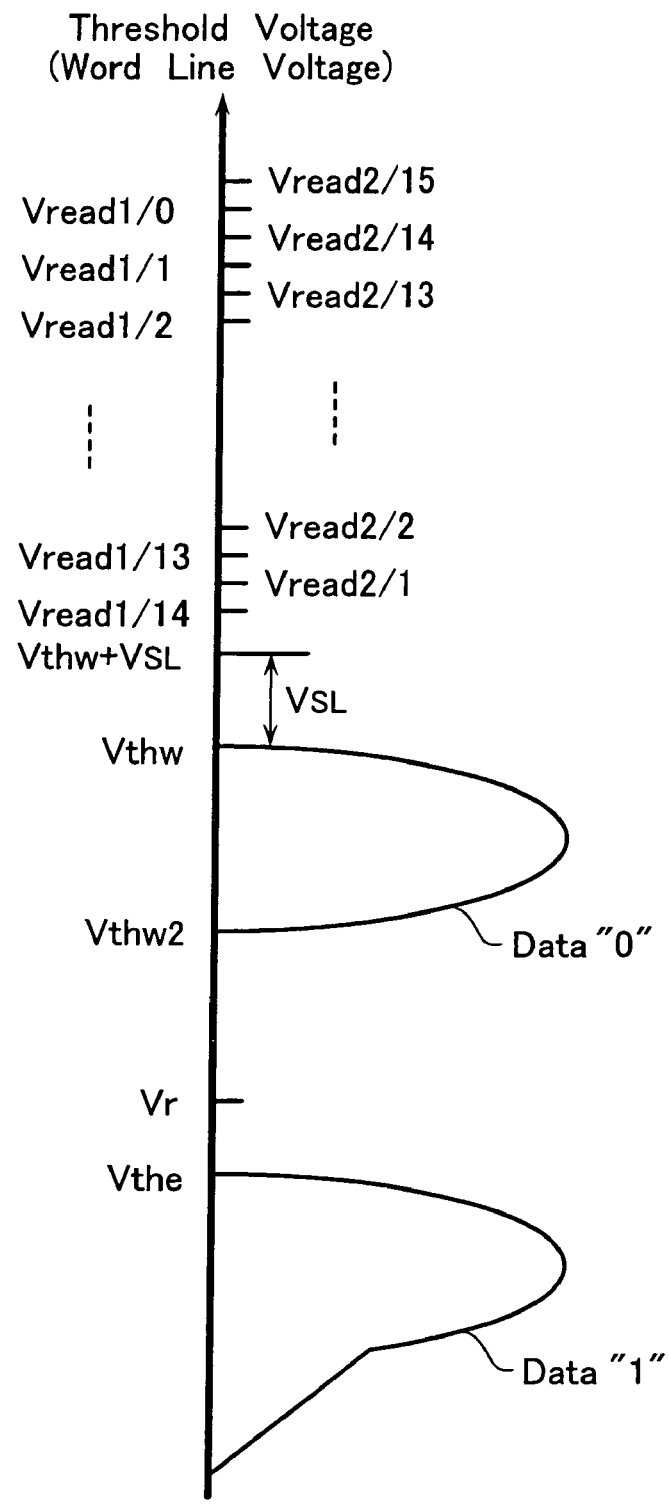
FIG. 16 shows an example of pass voltages set in a data read operation in accordance with this embodiment.

FIG. 16 shows a relationship between data threshold voltage distributions and pass voltages Vread1/z, Vread2/z in this embodiment, corresponding to FIG. 12. As unselected cell(s) located on the drain side (i.e., common source line SL side) of a selected cell become more, the pass voltage Vread1/z applied to the unselected cell(s) is set to be higher. For example, Vread1/0 used in case a memory cell M0 nearest to the bit line BL is selected, and Vread1/14 used in case a memory cell M14 near to the common source line SL is selected are set as follows: Vread1/0>Vread1/14.

In general, assuming that the integer "z", which is a position index of word line WLz, takes an arbitrary value "i" or "j" (where, i>j), it should be satisfied with a relationship of: Vread1/j ≧Vread1/i.

Further, giving attention to the unselected memory cells (i.e., unselected word lines) located on the source side (i.e., bit line BL side) of a selected memory cell, the pass voltage Vread2/z is set as follows. Pass voltage Vread2/15 applied to the unselected memory cells located on the source side of the selected memory cell as shown in FIG. 15A, pass voltage Vread2/13 applied to the unselected memory cells on the source side of the selected memory cell as shown in FIG. 15B, and pass voltage Vread2/2 applied to the unselected memory cells on the source side of the selected memory cell as shown in FIG. 15C are set in the relationship of: Vread2/15>Vread2/13>Vread2/2.

That is, another feature of this embodiment is defined as: the more unselected word line(s) located on the source side (i.e., bit line side) of a selected memory cell, the higher the pass voltage Vread2/z applied to the unselected word line(s) located on the source line side. In general, assuming that the integer "z", which is a position index of word line WLz, takes an arbitrary value "i" or "j" (where, i>j), it should be satisfied with a relationship of: Vread2/i≧Vread2/j.

According to this embodiment, the same effects may be obtained as in the above-described embodiment 1. That is, setting the pass voltage Vread2 applied to unselected memory cells located on the bit line side of a selected memory cell to be higher as these unselected memory cells become more, the source series resistance of the selected memory cell will be kept low. Further, setting the pass voltage Vread1 applied to unselected memory cells located on the common source line SL side of a selected memory cell to be higher as these unselected memory cells become more, the variation of drain conductance of the selected memory cell will be suppressed.

In addition, the variation of read current, which depends on the selected memory cell's position and unselected cells' data, is suppressed, whereby data read may be performed at a high rate. With keeping the maximum of data read time constant, it is possible to reduce the maximum of electro-magnetic noise due to the read current. In other words, data read can be performed without receiving the influence of capacitive coupling between the bit lines, and this leads to possibility of data judging at a high rate and high reliability with reducing the probability of erroneous read due to electro-magnetic noises.

Further, since the maximum current value of a selected memory cell may be kept small, the potential variation of the reference potential line SL becomes less, and it also becomes difficult that the threshold voltage of the selected cell varies in accordance with the drain voltage variation thereof. In addition, as a result of reduction of the maximum bit line current, wiring resistance increase, which is based on the electro-migration due to current stress, does not occur, thereby suppressing the reliability deterioration. Still further, it is possible to suppress threshold voltage variations and increased leakage currents of transistors due to heat increasing. Since the minimum read current is kept the same as that in the conventional case, it is possible to prevent the data read time from being increased due to decrease of the read current.

Further, since the erroneous write stress, which is applied to unselected memory cells connected in series to a selected memory cell, is reduced, it becomes possible to lessen the voltage separating gap between "1" data threshold voltage distribution and "0" data threshold voltage distribution. Accordingly, the pass voltages Vread1/z and Vread2/z may be set to be lower, and this leads to reduction of the area of the pass voltage generator and boost time thereof, and achievement of high-reliable memory devices.

The variation of channel conductance of unselected memory cells, in case these memory cells are changed from erase states to write states, is proportional to [1/(Vread2/z−Vthw−V0)−1/(Vread2/z−Vthe−V0)] as well as the studied result for Vread1/z in the above-described embodiment 1. Therefore, boosting Vread2/z, it becomes possible to suppress the resistance increase of unselected memory cells located on the source side of a selected memory cell, which is due to threshold voltage variation of the unselected memory cells. That is, according to the present invention, whichever unselected memory cells on the source side or drain side of a selected memory cell are changed from erase states to write states, it is possible to suppress the threshold voltage variation of the selected memory cell due to the source potential variation.

Since the resistance up of unselected memory cells located on the source side of a selected memory cell is accompanied by a threshold voltage up of the selected memory cell due to a substrate bias effect, the threshold voltage up is larger than that in a case the resistance of unselected memory cells located on the drain side of the selected memory cell is increased to the same value. Therefore, it is desirable for suppressing the threshold voltage variation that the maximum value Vread2/15 in the pass voltages Vread2/z is set to be higher than the maximum value Vread1/0 in the pass voltages Vread1/z.

In case the entire memory cells M0–M15 are subjected to a certain number of data read operations in this embodiment, it is possible to decrease the total Vread stress of the entire unselected memory cells with maintaining the minimum read current in comparison with a conventional case where all data read operations are performed with a constant pass voltage equal to Vread2/0. This is the same as the above-described embodiment 1.

Figure 17:
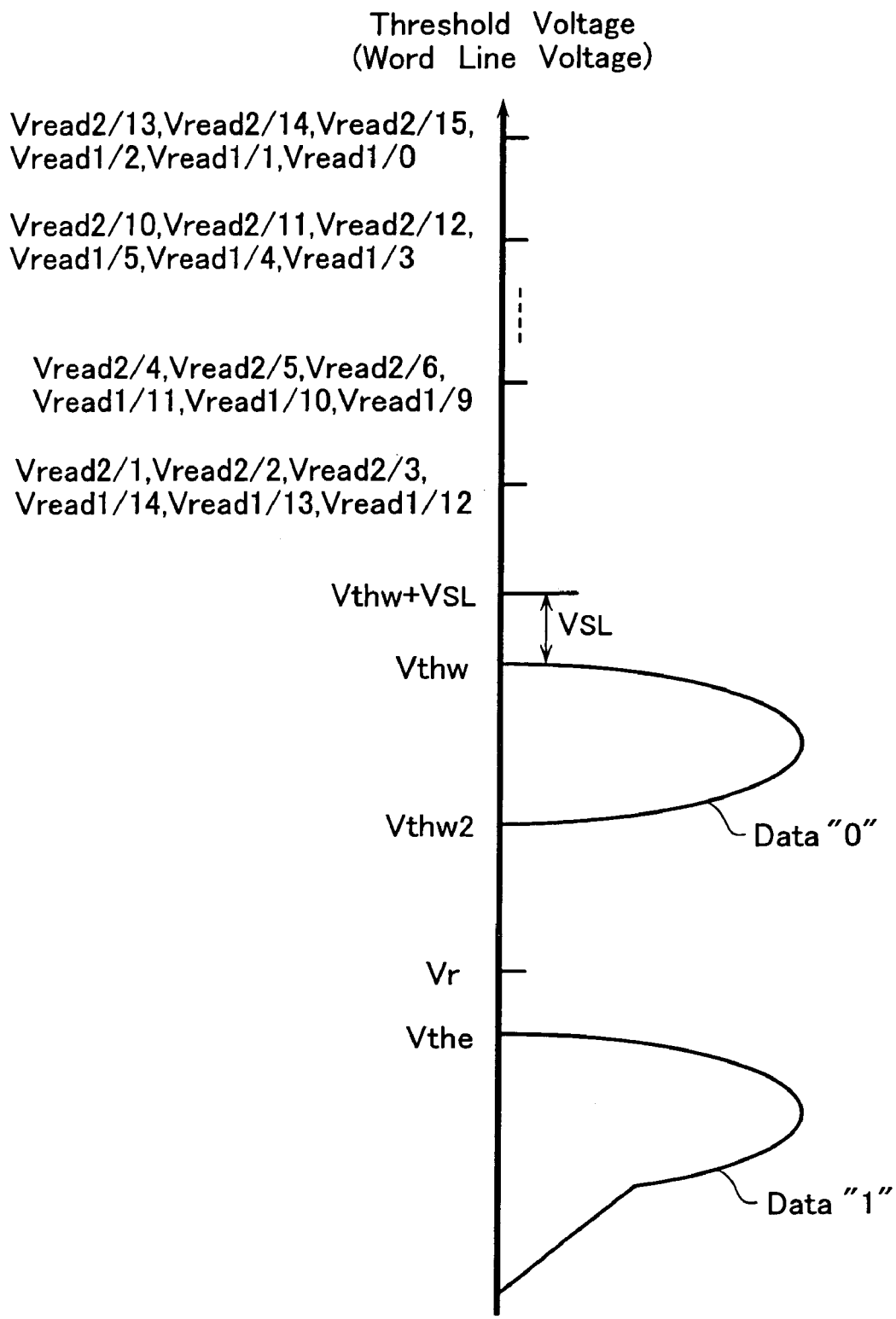
FIG. 17 shows another example of pass voltages set in a data read operation in accordance with this embodiment.
Figure 18A:
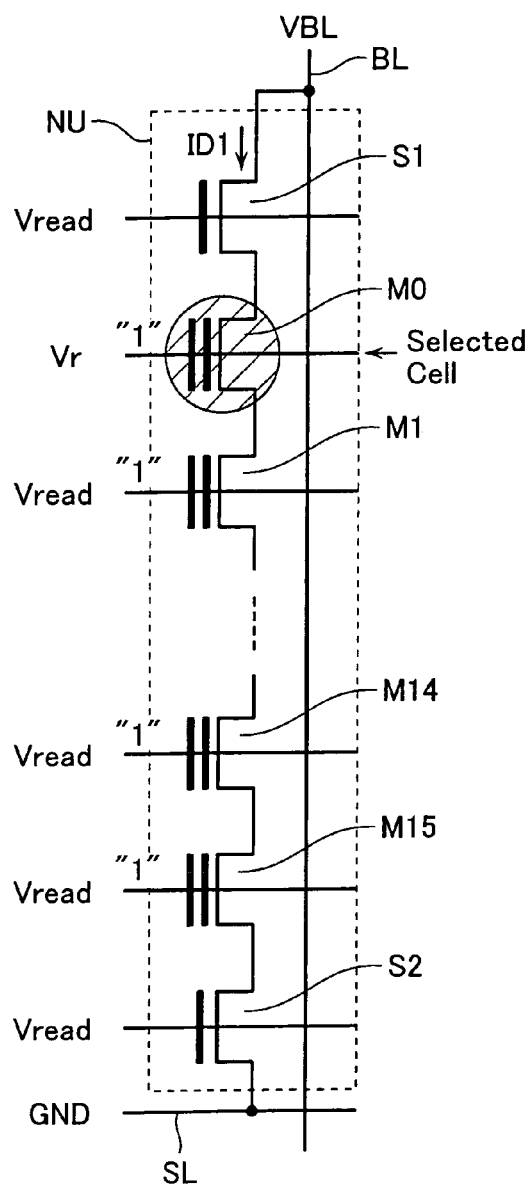
FIGS. 18A and 18B show voltage application states at data read times in a conventional flash memory.
Figure 18B:
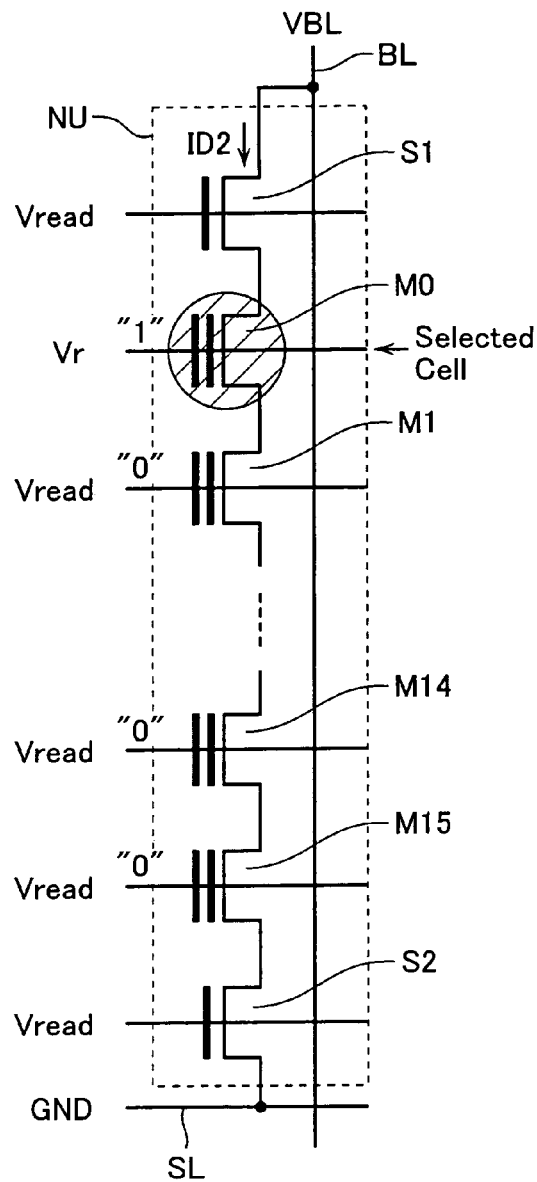
Figure 20:
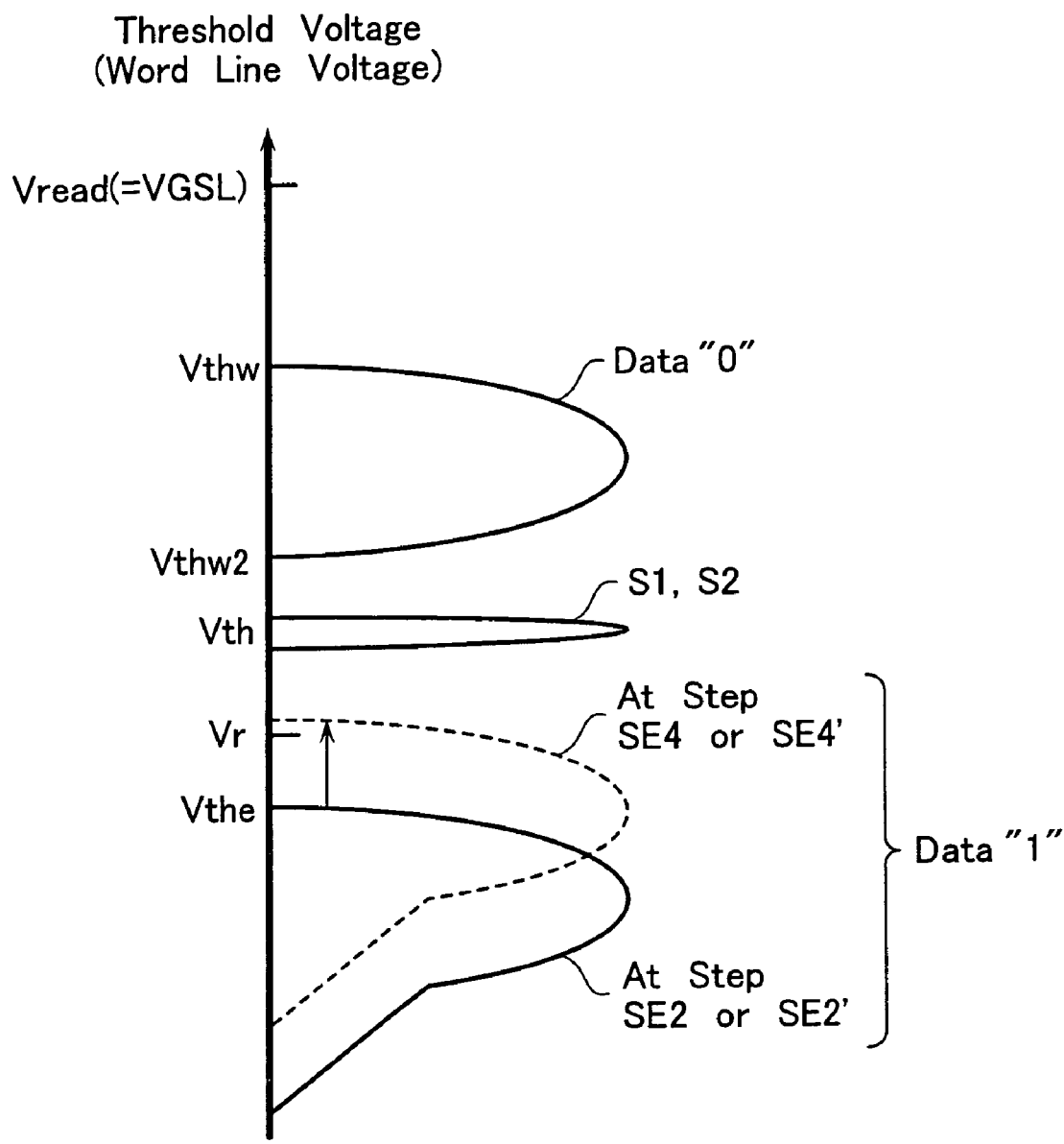
FIG. 20 is a diagram showing data threshold distributions of a NAND-type flash memory.
Figure 21:
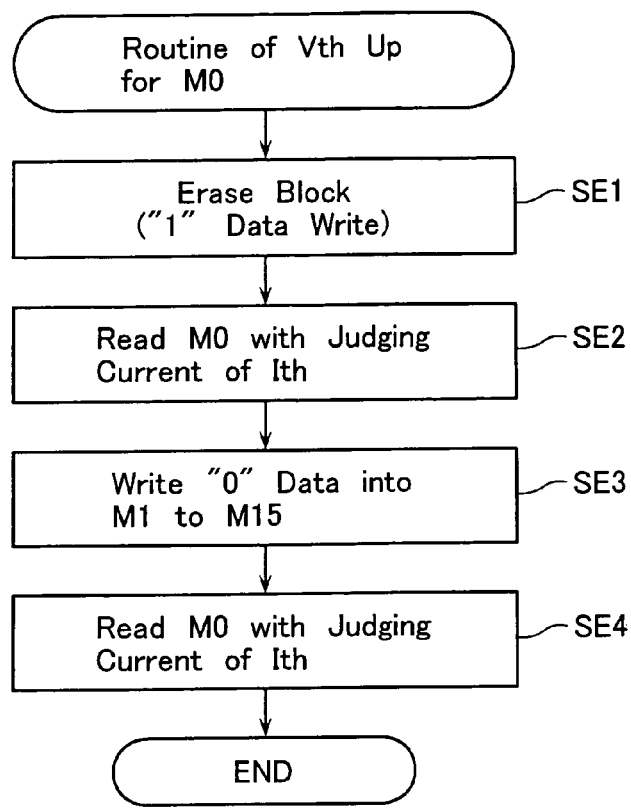
FIG. 21 is a diagram showing an operation sequence in which a threshold variation occurs in appearance in a conventional NAND-type flash memory.
Figure 22:
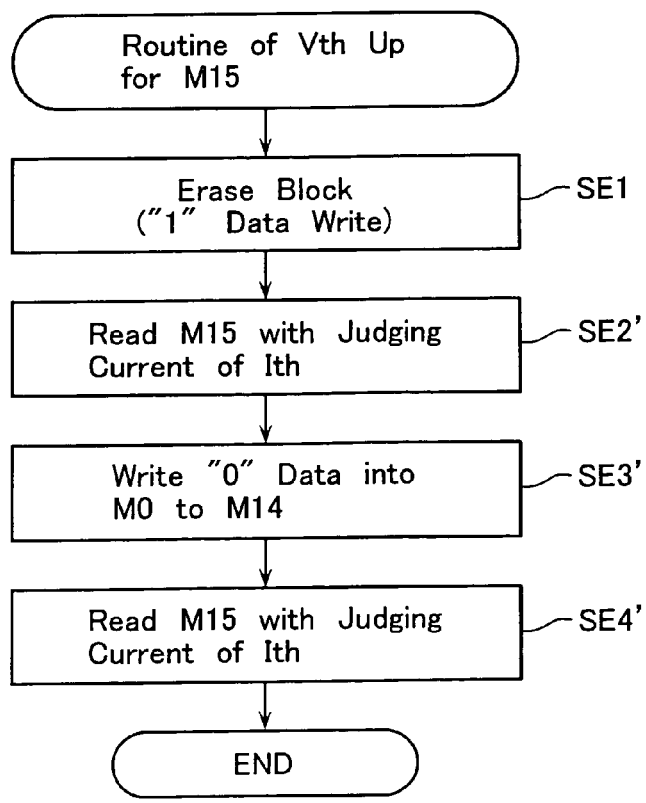
FIG. 22 is a diagram showing another operation sequence in which a threshold variation occurs in appearance in a conventional NAND-type flash memory.

FIG. 17 shows another example of the pass voltage setting. In this example, the selected memory cell positions "z" are classified into three groups in the range of z=0 to 15, and an identical pass voltage is used in each group such as: Vread2/15=Vread2/14=Vread2/13, Vread2/12=Vread2/11=Vread2/10, . . . , Vread2/3=Vread2/2=Vread2/1, and Vread1/14=Vread1/13=Vread1/12, Vread1/11=Vread1/10=Vread1/9, . . . , Vread1/2=Vread1/1=Vread1/0.

As described above, the pass voltages Vread1/z and Vread2/z may be grouped. In general, supposing that an arbitrary value "i" or "j" is taken in a range of 1 to 15 which corresponds to a selected cell position "z", it is satisfied with the relationships of: Vread1/j≧Vread1/i and Vread2/i≧Vread2/j in case of i>j. With this pass voltage application, it is possible to suppress the erase threshold voltage up due to read disturbance in comparison with the conventional case. Further, applying such the grouped pass voltages as described above, it becomes possible to decrease the signal bits necessary for the logic circuit 105 including a logical adder circuit and D/A converter 104, thereby reducing these circuit areas.

In this embodiment, setting the pass voltage Vread under a condition that the threshold voltage up due to read disturbance is the same as the conventional case, i.e., max[ΣΔQ (Vread1/k),(Vread2/k)] is the same as the conventional case, and satisfying the relationships of Vread1/j≧Vread1/i and Vread2/≧Vread2/j in case of i>j (where "i" and "j" are arbitrary values taken in a range of 1 to 15 which corresponds to a selected cell position "k"), the total drain conductance of unselected memory cells in case the memory cell M15 is selected may be higher than that in the conventional case. Therefore, the difference between the maximum and minimum values of the read current may be made less. This makes possible to judge data at a high rate. In addition, this makes possible to reduce a generation probability of erroneous read operations due to electromagnetic noises, thereby improving the reliability of the memory device.

This embodiment is effective also in a write scheme in which memory cells in a NAND cell unit are written in a random order after a block has been erased at a time. That is, that Vread2/z (z=1, 2, . . . ,15) is changed as described above is equivalent to that Vread2 is increased when the number of unselected memory cells located on the source side of a selected memory cell is large, i.e., source series resistance of the memory cell is large. In other words, the variation of the source series resistance, which depends usually on the position of the selected memory cell, is suppressed. Therefore, difference between the source series resistance at a write-verify read time and that at a normal read time becomes small, thereby suppressing the threshold voltage variation in appearance due to source potential variation of the selected memory cell.

Especially, the pass voltage setting scheme of Vread1/z (z=0, 1, . . . ,14), which applied to unselected memory cells on the drain side of a selected memory cell, is effective in such a data write method that memory cells are sequentially selected from one nearest to the bit line after having erased a block at a time. In this write scheme, a data state of unselected memory cells at a write-verify read time for a selected memory cell is the same as that at a normal read time for the selected memory cell. That is, there is no difference is source series resistances between the two read times. Therefore, the selected memory cell's threshold voltage variation in appearance will be suppressed.

Further, since the erroneous write stress at a data read time with respect to unselected memory cells connected in series to a selected memory cell may be reduced, the threshold voltage gap, which separates "0" data from "1" data, may be lessened. Therefore, such a data disturbance due to that data threshold voltage distributions are overlapped may be reduced. Based on a fact that the threshold voltage separating gap becomes lessened, it is possible to lower the "0" data threshold voltage. This leads to reduce the write time, write voltage and the upper limit of the pass voltage Vread, and reduce the circuit areas of the write voltage generator, Vread generator and the like.

As shown in FIGS. 15A–15D, the voltage applied to the gates of select transistors S1 and S2 is set to be Vcc, or pass voltages Vread1/z or Vread2/z. With this voltage application, in case two bit lines adjacent to a selected bit line serves as shield bit lines, it is possible to suppress the read disturbance on memory cells coupled to the shield bit line. Further, the total Vread stress may be suppressed without lessening the minimum cell current in comparison with a conventional case where an identical pass voltage equal to Vread2/15 is used for reading all cells.

Embodiment 3

EEPROM flash memories in accordance with the above-described embodiments may be adapted to various applications such as flash memory cards installed detachable to various electric devices, and other flash memory systems.

Figure 23:
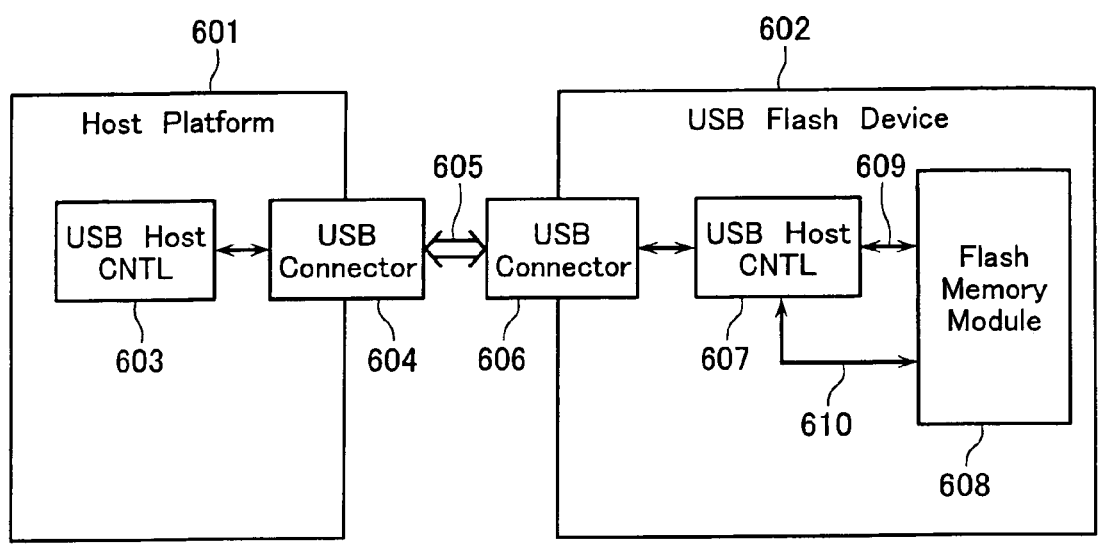
FIG. 23 is a diagram showing an electric device in accordance with an embodiment.

FIG. 23 shows a flash memory system, which is another application example of the EEPROM chip incorporating the principles of any one of the embodiments 1 and 2 stated supra. This flash memory system is generally made up of a host platform 601 and its associated universal serial bus (USB) flash device 602. The host platform 601 is connected to the USB flash device 602 through a USB cable 605. Host platform 601 is connected by a USB host connector 604 to USB cable 605. USB flash device 602 is connected to USB cable 605 via a USB flash device connector 606.

The host platform 601 has a USB host controller 603 for controlling packet data transmission over a USB bus(es). The USB flash device 602 has at least one flash memory module 608 and a USB flash device controller 607 which controls this module 608 and also controls an interface relative to the USB bus of USB flash device 602. It is the flash memory module 608 that includes the EEPROM chip as has been explained in the embodiments 1–4.

When the USB flash device 602 is plugged and connected to the host platform 601, standard USB enumeration or "list-up" processing gets started. In this processing, host platform 601 recognizes USB flash device 602 and selects an appropriate mode for communication with USB flash device 602 and then performs data transfer/receive operations between itself and USB flash device 602 via a first-in/first-out (FIFO) buffer for storage of transfer data, called "endpoint". Host platform 601 recognizes via another endpoint a change in physical and electrical states, such as plugging or unplugging of USB flash device 602, and receives a packet or packets relevant thereto, if any.

The host platform 601 generates and sends a request packet toward the USB host controller 603 to request services from the USB flash device 602. USB host controller 603 sends forth the packet onto USB cable 605. If USB flash device 602 is a device which has the endpoint that accepted this request packet, then these requests are to be received and accepted by USB flash device controller 607.

The USB flash device controller 607 performs various operations which include reading data out of the flash memory module 608, writing data into flash memory module 608, and erasing the data. In addition, flash device controller 607 supports basic USB functions such as USB address acquisition or else. Controller 607 controls flash memory module 608 by sending several signals including control signals such as chip enable/CE and others, a read enable signal, and a write enable signal via a control line 609 for control of an output of flash memory module 608.

The flash memory module 608 is connected to the USB flash device controller 607 via an address/data bus 610 also The address/data bus 610 is used to transfer a read, write or erase command with respect to flash memory module 608 and also addresses and data of this module 608.

In order to notify the host platform 601 of a result and state with respect to various operations as requested from host platform 601, the USB flash device 602 transfers thereto a status packet by using a status endpoint (endpoint 0). In this processing, host platform 601 checks whether the status packet is present or not (poling), while USB flash device 602 returns a vacant packet(s) or alternatively the status packet per se in cases where any new state message packets are absent.

It is apparent from the description above that in accordance with this embodiment, it is possible to implement various kinds of functions of the USB flash device, which is one application example of the EEPROM chip embodying the invention. Optionally it is also possible to eliminate use of the USB cable 605 so that the connectors 604 and 606 are directly connected together.

This invention should not exclusively be limited to the illustrative embodiments stated above. For example, the data read schemes described in the embodiments may be adapted to verify-read operations for setting a write data threshold voltage distribution to be in a certain range. With this application, it is possible to make the threshold voltages just after write and at a read time evened.

The above-described embodiments are also applicable to multi-value memory devices such as a four-value memory device in which four threshold voltage states are stored in a memory cell. For example in this case, supposing that four values are defined as first, second, third and fourth data states in order of height, the upper limit Vthw of "0" data threshold voltage shown in FIG. 12 may be defined as the upper limit of the first data state with the highest threshold voltage; and Vthw2 as the lower limit of the third data state. Since, in NAND-type multi-value memory devices, which are designed to store four or more threshold voltages as multi-value data, there is a problem for all data states except a date state with the highest threshold voltage that threshold voltage variations of data states become troublesome, it is required to take large voltage gaps among the threshold voltage distributions of the respective data states. Apply the embodiment 1 or 2 to such multi-value storing memory, and it is possible to effectively make the above-described threshold voltage gaps small.

Further, the present invention is applied to not only floating gate-type EEPROMs but also MONOS-type EEPROMs in which an insulator film such as SiON, SiN, AL2O3 and the like is used as a charge storage layer. In addition, the present invention is applied to not only EEPROMs having non-volatile memory cells with a MISFET structure, but also ones having other current sensing type memory cells connected in series, each of which stores data in a non-volatile manner in principle as defined by whether a cell current flows or not, or whether the cell current is large or not. Therefore, the present invention is effectively applied to ferroelectric memory devices, which store data as defined by polarization states, and ferromagnetic memory device which store data as defined by directions or strengths of magnetization, in case a plurality of memory cells therein are connected in series.

For fabrication of element isolation dielectric films and interlayer dielectric films, it is possible to employ, in addition to methods for converting silicon into either silicon oxide films or silicon nitride films, methods for doping or injecting oxygen ions into deposited silicon or alternatively methods for oxidizing deposited silicon, by way of example. In the case of the MONOS type memory cells, the charge storage layer may be formed of TiO2, Al2O3 or tantalum oxide film, a strontium titanate film, a barium titanate film, a zirconium titanate lead film, or a multilayer film using a mixture of more than two of these materials.

Although in the above embodiments the semiconductor substrate is a p-type silicon (Si) substrate, the substrate may be replaced with any other silicon-containing single-crystal semiconductor substrates, such as an n-type Si substrate, silicon-on-insulator (SOI) substrate, SiGe mixed-crystal substrate, SiGeC mixed-crystal substrate, or any equivalents thereto. For the gate electrodes, it is possible to use, in addition to the polysilicon (poly-Si), other materials including but not limited to SiGe mixed-crystal, SiGeC mix-crystal, silicide or polycide such as TiSi, NiSi, CoSi, TaSi, WSi, MbSi and the like, and metal such as Ti, Al, Cu, TiN, W and the like. The gate electrode material may be formed of a polycrystalline film or laminated film. Further, it is possible to make use of amorphous Si, amorphous SiGe, or amorphous SiGeC or a multilayer structure thereof as a gate electrode. The charge storage layer may be formed with a dotted pattern. Although in the above-noted embodiments the memory cells and select transistors are both designed to have the n-channel type, p-channel type memory cells and select transistors are alternatively employable.

Further, it will be understood by those skilled in the art that various changes in form and detail may be made without departing from the spirit, scope, and teaching of the invention.

What is claimed is:

1. A semiconductor memory device comprising a memory cell unit with a plurality of electrically rewritable memory cells connected in series, two ends thereof being coupled to a data transfer line and a reference potential line via select transistors, respectively, wherein said device has a data read mode defined as to detect a read current or a change thereof flowing between said data transfer line and said reference potential line, and judge data of a selected memory cell in said memory cell unit under the condition of: applying a read voltage to said selected memory cell, the read voltage being set to turn on or off said selected memory cell in accordance with data thereof; applying a pass voltage to remaining unselected memory cells, the pass voltage being set to turn on the remaining unselected memory cells without regard to data thereof; and making said select transistors on, and wherein in said data read mode, the more unselected memory cell or cells located on the source side of said selected memory cell, the higher the pass voltage applied to the unselected memory cell or cells located on the source side of said selected memory cell.

2. The semiconductor memory device according to claim 1, wherein said data read mode is defined as the read current is carried from said data transfer line to said reference potential line, and wherein the more unselected memory cell or cells connected in series between said reference potential line and said selected memory cell, the higher the pass voltage applied to the unselected memory cell or cells connected in series between said reference potential line and said selected memory cell.

3. The semiconductor memory device according to claim 1, wherein said data read mode is defined as the read current is carried from said reference potential line to said data transfer line, and wherein the more unselected memory cell or cells connected in series between said data transfer line and said selected memory cell, the higher the pass voltage applied to the unselected memory cell or cells connected in series between said data transfer line and said selected memory cell.

4. An electric device equipped with a semiconductor memory device defined in claim 1.

5. The semiconductor memory device according to claim 1, wherein said memory device is configured to store four or more threshold voltage states.

6. A semiconductor memory device comprising a memory cell unit with a plurality of electrically rewritable memory cells connected in series, two ends thereof being coupled to a data transfer line and a reference potential line via select transistors, respectively, wherein said device has a data read mode defined as to detect a read current or a change thereof flowing between said data transfer line and said reference potential line, and judge data of a selected memory cell in said memory cell unit under the condition of: applying a read voltage to said selected memory cell, the read voltage being set to turn on or off said selected memory cell in accordance with data thereof; applying a pass voltage to remaining unselected memory cells, the pass voltage being set to turn on the unselected memory cells without regard to data thereof; and making said select transistors on, and wherein a first pass voltage applied to first unselected memory cell or cells located on the drain side of said selected memory cell and a second pass voltage applied to second unselected memory cell or cells located on the source side of said selected memory cell are changed in level in accordance with the position of said selected memory cell within said memory cell unit.

7. The semiconductor memory device according to claim 6, wherein the more the first unselected memory cell or cells, the higher the first pass voltage; and the more the second unselected memory cell or cells, the higher the second pass voltage.

8. The semiconductor memory device according to claim 6, wherein said data read mode is defined as the read current is carried from said data transfer line to said reference potential line, and wherein the more the first unselected memory cell or cells connected in series between said data transfer line and said selected memory cell, the higher the first pass voltage applied to the first unselected memory cell or cells; and the more the second unselected memory cell or cells connected in series between said reference potential line and said selected memory cell, the higher the second pass voltage applied to the second unselected memory cell or cells.

9. The semiconductor memory device according to claim 6, wherein said data read mode is defined as the read current is carried from said reference potential line to said data transfer line, and wherein the more the first unselected memory cell or cells connected in series between said reference potential line and said selected memory cell, the higher the first pass voltage applied to the first unselected memory cell or cells; and the more the second unselected memory cell or cells connected in series between said data transfer line and said selected memory cell, the higher the second pass voltage applied to the second unselected memory cell or cells.

10. An electric device equipped with a semiconductor memory device defined in claim 6.

11. The semiconductor memory device according to claim 6, wherein said memory device is configured to store four or more threshold voltage states.

12. A semiconductor memory device comprising:

a memory cell unit with a plurality of electrically rewritable memory cells connected in series, control gates thereof being coupled to different data control lines with each other, two ends thereof being coupled to a data transfer line and a reference potential line via select transistors, respectively;

an internal voltage generating circuit configured to generate various control voltages applied to said data control lines in accordance with operation modes;

a data control line drive circuit configured to transfer the control voltages output from said internal voltage generating circuit and drive the control lines in accordance with address input; and a sense amplifier circuit coupled to said data transfer line to detect a read current or a change thereof flowing through said memory cell unit, thereby judging data of a selected memory cell, wherein said internal voltage generating circuit comprises: a first pass voltage generator configured to output a first pass voltage applied to first unselected data control line or lines located on the drain side of a selected memory cell driven by a selected data control line at a data read time, the first pass voltage being changed in level in response to a selection address of said selected data control line; and a second pass voltage generator configured to output a second pass voltage applied to second unselected data control line or lines located on the source side of said selected memory cell driven by said selected data control line at the data read time, the second pass voltage being changed in level in response to the selection address of said selected data control line.

13. The semiconductor memory device according to claim 12, wherein the more the first unselected data control line or lines, the higher the first pass voltage; and the more the second unselected data control line or lines, the higher the second pass voltage.

14. The semiconductor memory device according to claim 12, wherein said device has a data read mode defined as to carry a read current from said data transfer line to said reference potential line, and wherein said first pass voltage generator configured to generate in the data read mode a first pass voltage applied to first unselected data control line or lines, which are coupled to first unselected memory cell or cells connected in series between said data transfer line and said selected memory cell, in such a manner that the more the first unselected data control line or lines, the higher the first pass voltage; and said second pass voltage generator configured to generate in the data read mode a second pass voltage applied to second unselected data control line or lines, which are coupled to second unselected memory cells connected in series between said reference potential line and said selected memory cell, in such a manner that the more the second unselected data control line or lines, the higher the second pass voltage.

15. The semiconductor memory device according to claim 12, wherein said device has a data read mode defined as to carry a read current from said reference potential line to said data transfer line, and wherein said first pass voltage generator configured to generate in the data read mode a first pass voltage applied to first unselected data control line or lines, which are coupled to first unselected memory cell or cells connected in series between said reference potential and said selected memory cell, in such a manner that the more the first unselected data control line or lines, the higher the first pass voltage; and said second pass voltage generator configured to generate in the data read mode a second pass voltage applied to second unselected data control line or lines, which are coupled to second unselected memory cells connected in series between said data transferring and said selected memory cell, in such a manner that the more the second unselected data control line or lines, the higher the second pass voltage.

16. The semiconductor memory device according to claim 12, wherein each said first and second pass voltage generator includes: a reference signal generating circuit configured to generate a reference signal, the level of which is changed in accordance with address data for selecting a data control line in said memory cell unit; and a boost circuit configured to generate a pass voltage higher than a power supply voltage, level thereof being changed in response to said reference signal.

17. An electric device equipped with a semiconductor memory device defined in claim 12.

18. The semiconductor memory device according to claim 12, wherein said memory device is configured to store four or more threshold voltage states.

* * * * *